(12) United States Patent
Tseng et al.

(10) Patent No.: US 12,237,390 B2
(45) Date of Patent: Feb. 25, 2025

(54) LOW RESISTANCE CONTACT FEATURE

(71) Applicant: Taiwan Semiconductor Manufacturing Company, Ltd., Hsinchu (TW)

(72) Inventors: Szu-Wei Tseng, Hsinchu (TW); Wei-Yuan Lu, Taipei (TW); Wei-Yang Lee, Taipei (TW); Chia-Pin Lin, Hsinchu County (TW); Tzu-Wei Kao, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 414 days.

(21) Appl. No.: 17/750,028

(22) Filed: May 20, 2022

(65) Prior Publication Data

US 2023/0207653 A1    Jun. 29, 2023

Related U.S. Application Data

(60) Provisional application No. 63/294,102, filed on Dec. 28, 2021.

(51) Int. Cl.
| | | |
|---|---|---|
| *H01L 29/423* | (2006.01) | |
| *H01L 29/06* | (2006.01) | |
| *H01L 29/66* | (2006.01) | |
| *H01L 29/78* | (2006.01) | |

(52) U.S. Cl.
CPC .... *H01L 29/42392* (2013.01); *H01L 29/0661* (2013.01); *H01L 29/0669* (2013.01); *H01L 29/66545* (2013.01); *H01L 29/66719* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| | | |
|---|---|---|
| 9,754,840 B2 | 9/2017 | Lin et al. |
| 9,818,872 B2 | 11/2017 | Ching et al. |
| 10,032,627 B2 | 7/2018 | Lee et al. |
| 10,290,546 B2 | 5/2019 | Chiang et al. |

(Continued)

FOREIGN PATENT DOCUMENTS

TW    202133443 A    9/2021

*Primary Examiner* — Cory W Eskridge
(74) *Attorney, Agent, or Firm* — HAYNES AND BOONE, LLP

(57) ABSTRACT

Methods and semiconductor structures are provided. A method according to the present disclosure includes receiving a workpiece that includes a first gate structure disposed over a first active region, a second gate structure disposed over a second active region, a first gate spacer extending along a sidewall of the first gate structure and disposed at least partially over a top surface of the first active region, a second gate spacer extending along a sidewall of the second gate structure and disposed at least partially over a top surface of the second active region, and a source/drain feature. The method also includes treating a portion of the first gate spacer and a portion of the second gate spacer with a remote radical of hydrogen or oxygen, removing the treated portions, and after the removal, depositing a metal fill material over the source/drain feature.

20 Claims, 33 Drawing Sheets

(56) References Cited

U.S. PATENT DOCUMENTS

| | | | |
|---|---|---|---|
| 10,475,902 B2 | 11/2019 | Lee et al. | |
| 10,950,731 B1* | 3/2021 | Peng | H01L 29/0653 |
| 11,031,292 B2 | 6/2021 | Ju et al. | |
| 2019/0043967 A1 | 2/2019 | Mulfinger | |
| 2019/0165095 A1 | 5/2019 | Cheng | |
| 2021/0119020 A1 | 4/2021 | Mochizuki | |
| 2021/0249271 A1* | 8/2021 | Peng | H01L 29/785 |

* cited by examiner

LOW RESISTANCE CONTACT FEATURE

PRIORITY DATA

This application claims priority to U.S. Provisional Patent Application No. 63/294,102, filed Dec. 28, 2021, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

As the scaling down of IC devices continues to increase chip density, satisfactory formation of source/drain contacts of multi-gate devices is becoming ever challenging. For example, the presence of gate spacers may increase the aspect ratio of the source/drain contact opening. The increased aspect ratio may create challenges when depositing metal fill material in the source/drain contact opening. When a gap or a void is formed in the source/drain contact, the resistance of the source/drain contact may increase. While existing methods for forming multi-gate devices are adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
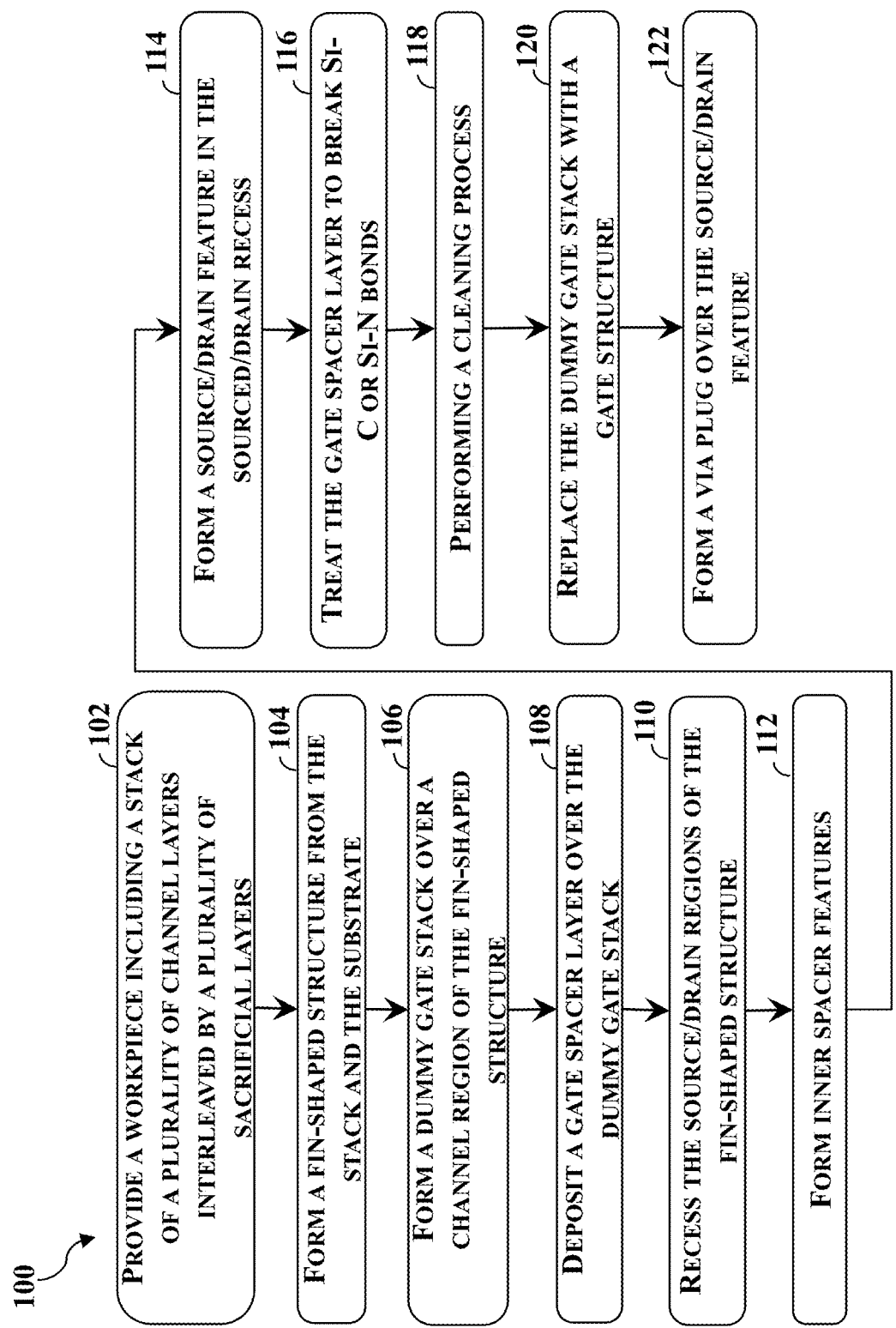
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to formation of a source/drain contact of an MBC transistor. Depending on shapes of channel members of an MBC transistor, the MBC transistor may also be referred to as a nanowire transistor or a nanosheet transistor. When a gate replacement process is adopted, a first dummy gate stack and a second dummy gate stack are formed over a first active region and a second active region, respectively. A first gate spacer layer is formed over a sidewall of the first dummy gate stack and a second gate spacer layer is formed over a sidewall of the second dummy gate stack. A source/drain feature is formed between the first active region and the second active region. An upper portion of the source/drain feature is disposed between the first gate spacer layer and the second gate spacer layer. According to an embodiment of the present disclosure, an outer portion of the first gate spacer layer and the second gate spacer layer are treated with remotely generally radical to break the Si—N and Si—C bond, rendering the treated outer portion more susceptible to removal. A selective cleaning process is then performed to remove the treated portion. This controlled trimming of the first gate spacer layer and the second gate spacer layer reduces the aspect ratio of the source/drain contact opening defined between the first gate spacer layer and the second gate spacer layer. This reduced aspect ratio promotes formation of void-free, low-resistance source/drain contact over the source/drain feature.

The various aspects of the present disclosure will now be described in more detail with reference to the figures. In that regard, FIG. 1 is a flowchart illustrating a method 100 of forming a semiconductor structure from a workpiece 200 (shown in FIGS. 2-29) according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-29, which are fragmentary cross-sectional views of workpiece 200 at different stages of fabrication according to various embodiments of the method 100 in FIG. 1. Because the workpiece 200 will be fabricated into a semiconductor structure or a semiconductor device, the workpiece 200 may be referred to herein as a semiconductor structure or a semiconductor device 200 as the context requires. For avoidance of doubts, the X, Y and Z directions in FIGS. 2-24 are perpendicular to one another. Throughout the present disclosure, unless expressly otherwise described, like reference numerals denote like features.

Figure 2:
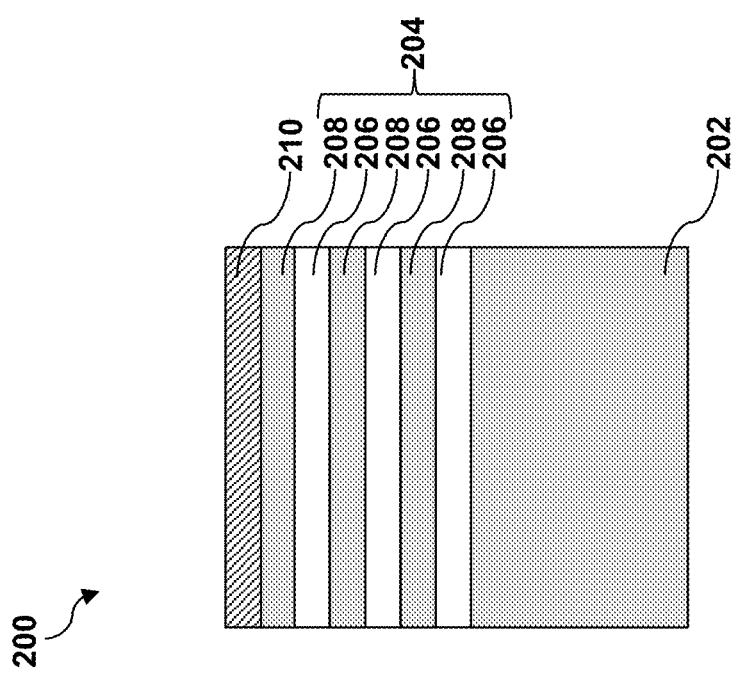
FIGS. 2-33 illustrate fragmentary cross-sectional views of a workpiece during a fabrication process according to the method of FIG. 1, according to one or more aspects of the present disclosure.

Referring to FIGS. 1 and 2, method 100 includes a block 102 where a stack 204 of alternating semiconductor layers is formed over the workpiece 200. As shown in FIG. 2, the workpiece 200 includes a substrate 202. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenic (As). In embodiments where the semiconductor device is n-type, a p-type doping profile (i.e., a p-type well or p-well) may be formed on the substrate 202. In some implementations, the p-type dopant for forming the p-type well may include boron (B) or gallium (Ga). The suitable doping may include ion implantation of dopants and/or diffusion processes. The substrate 202 may also include other semiconductors such as germanium (Ge), silicon carbide (SiC), silicon germanium (SiGe), germanium tin (GeSn), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. It can also be said that the channel layers 208 are interleaved by the sacrificial layers 206. The first and second semiconductor composition may be different. In some embodiments, the sacrificial layers 206 include silicon germanium (SiGe) or germanium tin (GeSn) and the channel layers 208 include silicon (Si). It is noted that three (3) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10. In the embodiments represented in FIG. 2, the stack 204 includes a bottommost sacrificial layer 206 and a topmost sacrificial layer 206. In the embodiments, the topmost sacrificial layer 206, which may be thicker than the other sacrificial layers, functions to protect the topmost channel layer and may be completely consumed in subsequent processes.

In some embodiments, all sacrificial layers 206 may have a substantially uniform first thickness and all of the channel layers 208 may have a substantially uniform second thickness. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel members, which are formed from the channel layers 208, for a subsequently-formed multi-gate device and the thickness of each of the sacrificial layers 206 is chosen based on device performance considerations.

The sacrificial layers 206 and channel layers 208 in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 atoms/cm$^3$ to about $1\times10^{17}$ atoms/cm$^3$), where for example, no intentional doping is performed during the epitaxial growth processes for the stack 204.

Figure 3:
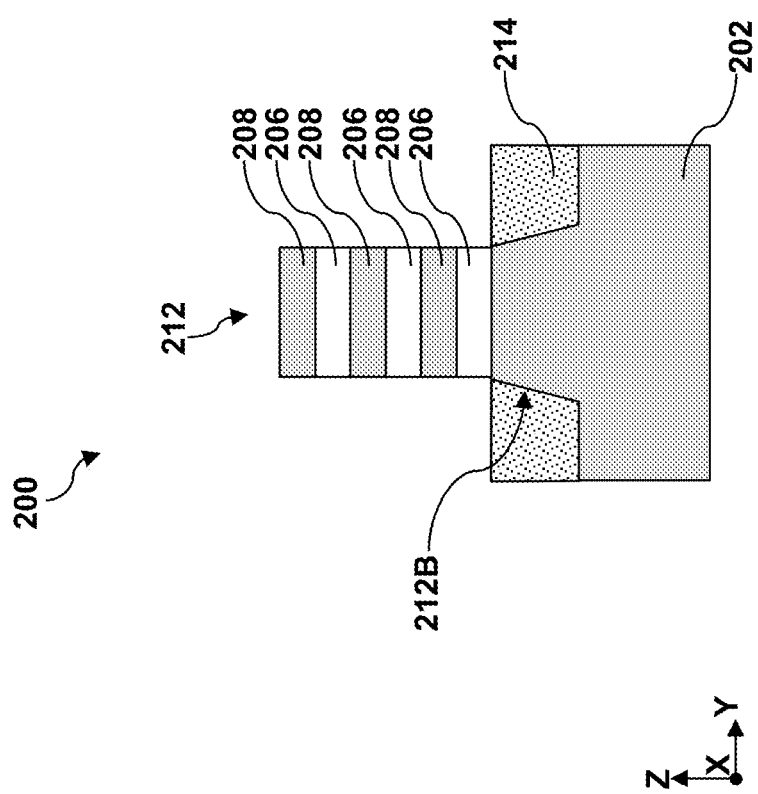

Referring still to FIGS. 1, 2 and 3, method 100 includes a block 104 where a fin-shaped structure 212 is formed from the stack 204 and the substrate 202. To pattern the stack 204, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer disposed over the pad oxide layer. The fin-shaped structure 212 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching) and/or other etching methods. As shown in FIG. 3, the etch process at block 104 forms trenches extending vertically through the stack 204 and a portion of the substrate 202. The trenches define the fin-shaped structures 212. In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 212 by etching the stack 204. As shown in FIG. 3, the fin-shaped structure 212 that includes the sacrificial layers 206 and the channel layers 208 extends vertically along the Z direction and lengthwise along the X direction. As shown in FIG. 3, the fin-shaped structure 212 includes a base fin structure 212B patterned from the substrate 202. The patterned stack 204, including the sacrificial layers 206 and the channel layers 208, is disposed directly over the base fin structure 212B.

An isolation feature 214 is formed adjacent the fin-shaped structure 212. In some embodiments represented in FIG. 3, the isolation feature 214 is disposed on sidewalls of the base fin structure 212B. In some embodiments, the isolation feature 214 may be formed in the trenches to isolate the fin-shaped structures 212 from a neighboring fin-shaped structure. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214 shown in FIG. 3. The fin-shaped structure 212 rises above the STI feature 214 after the recessing, while the base fin structure 212B is embedded or buried in the isolation feature 214.

Figure 4:
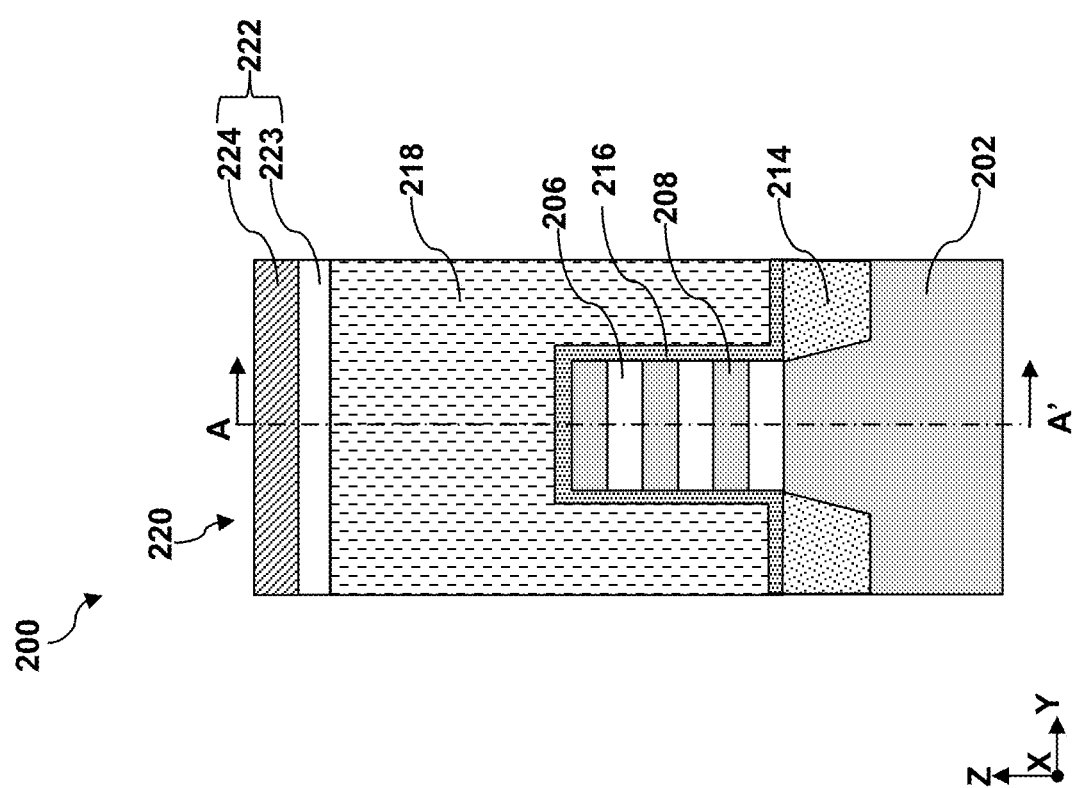
Figure 5:
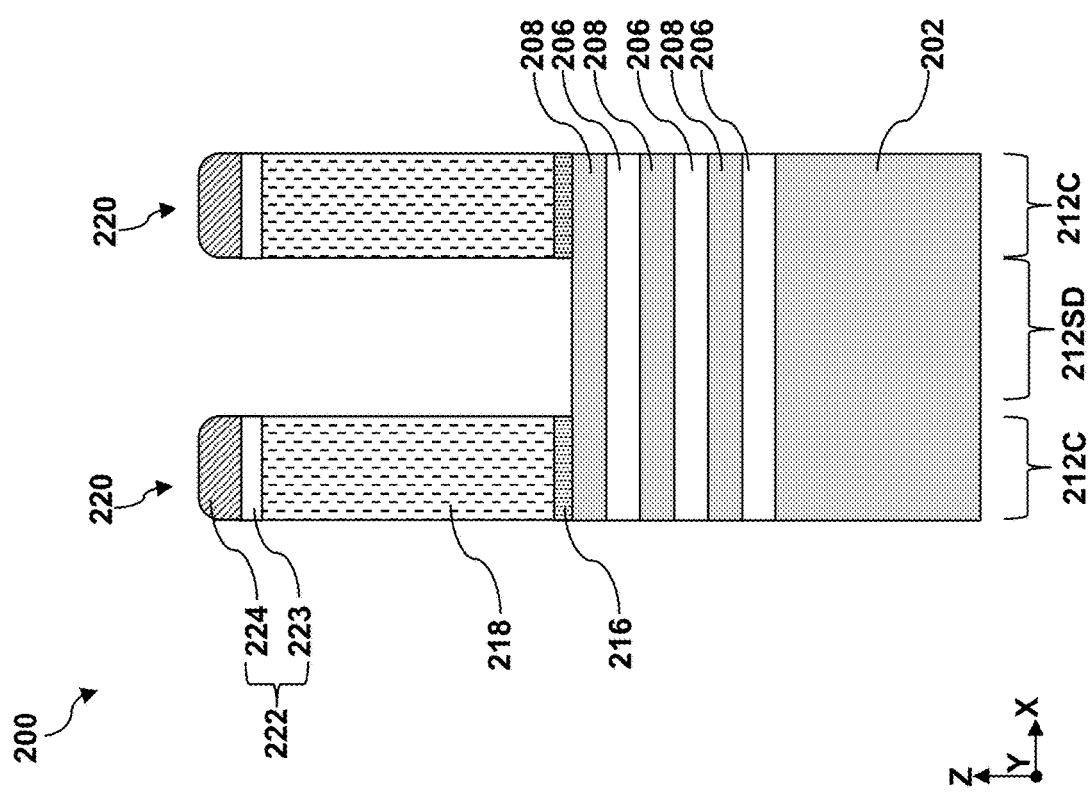

Referring to FIGS. 1, 4 and 5, method 100 includes a block 106 where a dummy gate stack 220 is formed over a channel region 212C of the fin-shaped structure 212. In some embodiments, a gate replacement process (or gate-last process) is adopted where the dummy gate stack 220 (shown in FIGS. 4 and 5) serves as a placeholder to undergo various processes and is to be removed and replaced by a functional gate structure. Other processes and configuration are possible. In some embodiments illustrated in FIG. 5, the dummy gate stack 220 is formed over the fin-shaped structure 212 and the fin-shaped structure 212 may be divided into channel regions 212C underlying the dummy gate stacks 220 and source/drain regions 212SD that do not underlie the dummy gate stacks 220. The channel regions 212C are adjacent the source/drain regions 212SD. As shown in FIG. 5, a source/drain region 212SD is disposed between two channel regions 212C along the X direction.

The formation of the dummy gate stack 220 may include deposition of layers in the dummy gate stack 220 and patterning of these layers. Referring to FIG. 4, a dummy dielectric layer 216, a dummy electrode layer 218, and a gate-top hard mask layer 222 may be blanketly deposited over the workpiece 200. In some embodiments, the dummy dielectric layer 216 may be formed on the fin-shaped structure 212 using a chemical vapor deposition (CVD) process, an ALD process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 5. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching) and/or other etching methods. In some embodiments, the gate-top hard mask layer 222 may include a silicon oxide layer 223 and a silicon nitride layer 224 over the silicon oxide layer 223. As shown in FIG. 5, the dummy gate stack 220 is patterned such that it is only disposed over the channel region 212C, not disposed over the source/drain region 212SD.

Figure 6:
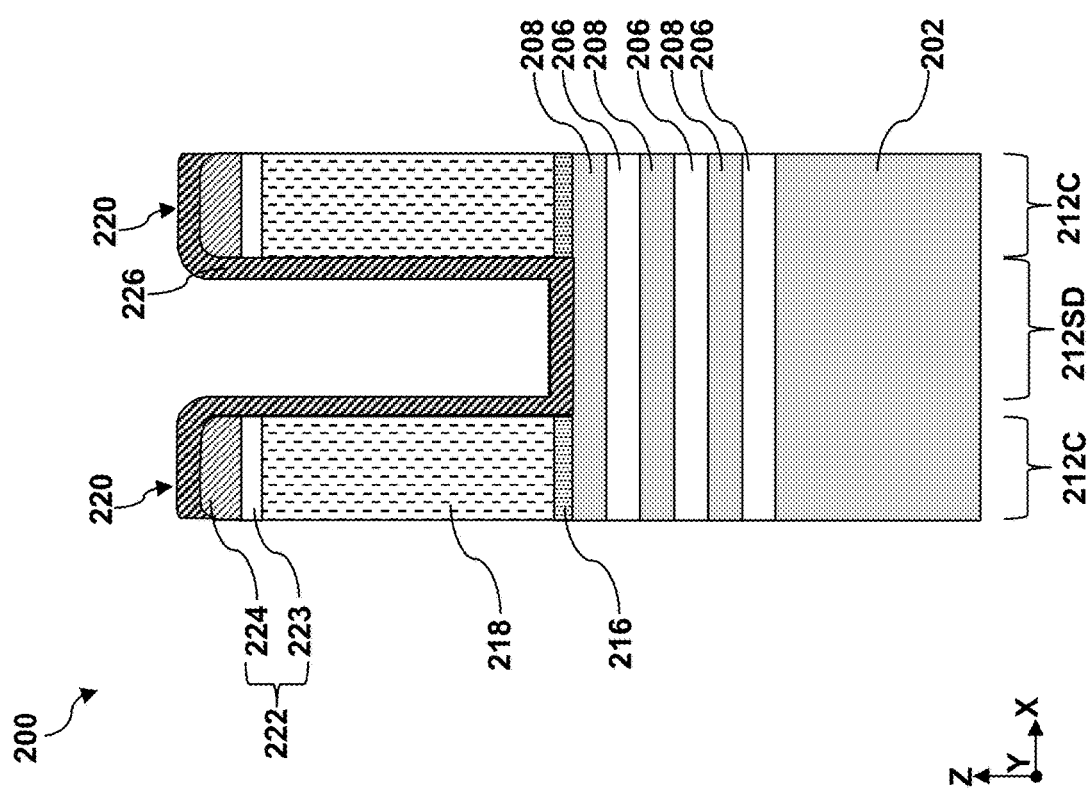

Referring to FIGS. 1 and 6, method 100 includes a block 108 where a gate spacer layer 226 is deposited over the workpiece 200, including over the dummy gate stacks 220 and a top surface of the source/drain region 212SD of the fin-shaped structure 212. In some embodiments, the gate spacer layer 226 is deposited conformally over the workpiece 200, including over top surfaces and sidewalls of the dummy gate stacks 220. In the depicted embodiment, the gate spacer layer 226 is in contact with sidewalls of the dummy dielectric layers 216 over the two channel regions 212C, shown in FIG. 6. The term "conformally" may be used herein for ease of description of a layer having substantially uniform thickness over various regions. According to the present disclosure, the gate spacer layer 226 is formed with a dielectric material that includes oxygen and at least one of carbon or nitrogen. In other words, the material of the gate spacer layer 226 includes not only Si—O bonding but also Si—C bonding or Si—N bonding. As will be described further below, this mixture of bonding allows the gate spacer layer 226 to change etch selectively when Si—C bonding and/or Si—N bonding are broken. The gate spacer layer 226 therefore may include silicon oxycarbide (SiOC, having Si—O bonding and Si—C bonding), silicon oxycarbonitride (SiOCN, having Si—O bonding, Si—C bonding and Si—N bonding) or silicon oxynitride (SiON, having Si—O bonding and Si—N bonding). In one embodiment, the gate spacer layer 226 may include silicon oxycarbonitride that includes Si—C bonding, Si—N bonding, and Si—O bonding. The gate spacer layer 226 may be deposited over the dummy gate stack 220 using processes such as, a CVD process, a subatmospheric CVD (SACVD) process, an ALD process, or other suitable process.

Figure 7:
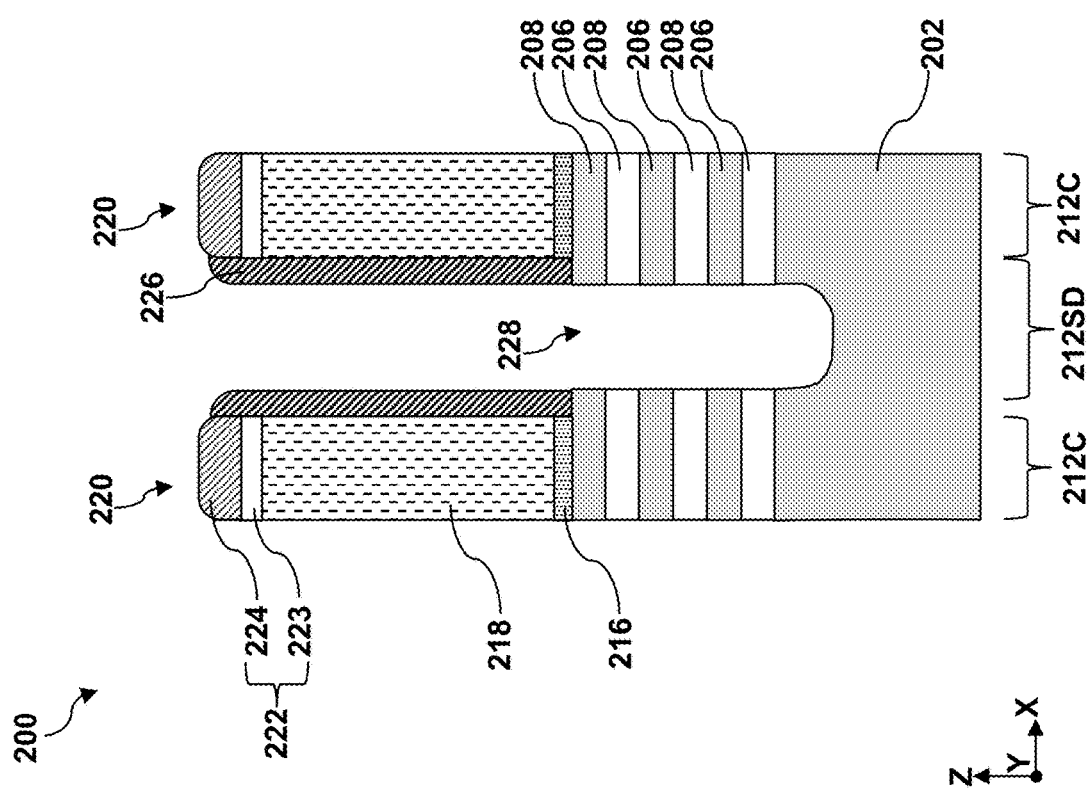

Referring to FIGS. 1 and 7, method 100 includes a block 110 where a source/drain region 212SD of the fin-shaped structure 212 is anisotropically recessed to form a source/drain trench 228. The anisotropic etch may include a dry etch or a suitable etch process that etches the source/drain regions 212SD and a portion of the substrate 202 in the source/drain region 212SD. The resulting source/drain trench 228 extends vertically through the depth of the stack 204 and partially into the substrate 202. An example dry etch process for block 110 may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As illustrated in FIG. 7, the source/drain region 212SD of the fin-shaped structure 212 is recessed to expose sidewalls of the sacrificial layers 206 and the channel layers 208. Because the source/drain trench 228 extends below the stack 204 into the substrate 202, the source/drain trench 228 include bottom surfaces and lower sidewalls defined in the substrate 202.

Figure 8:
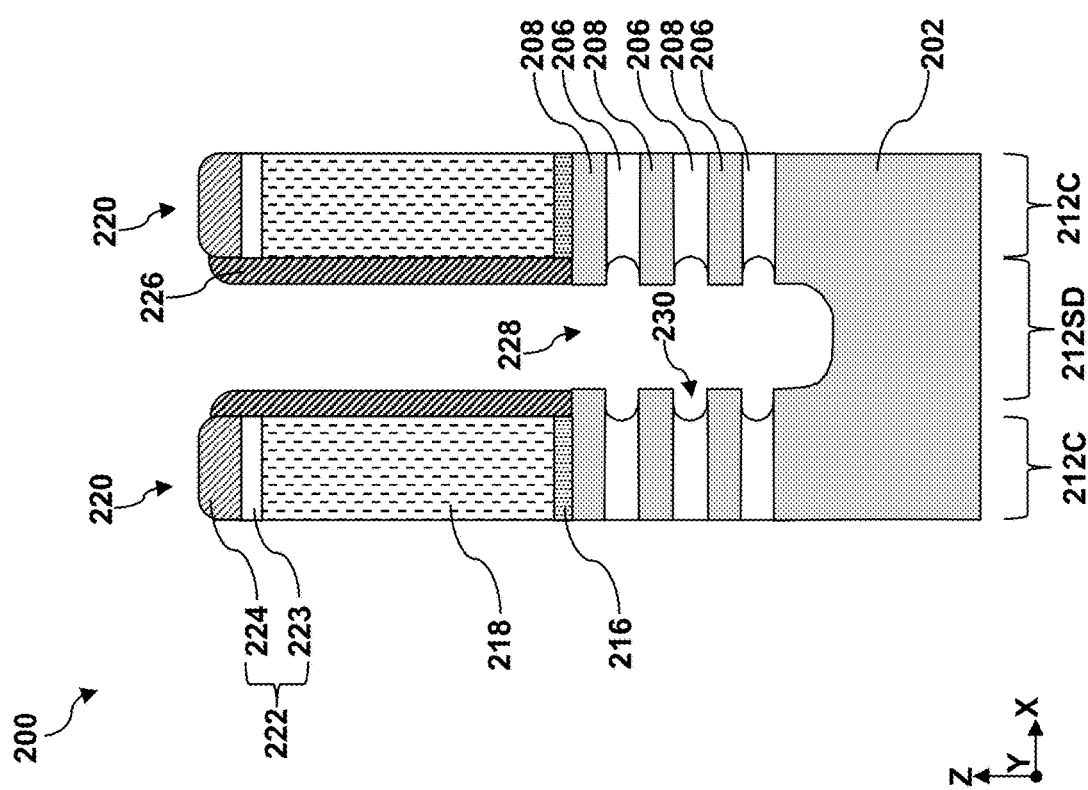

Referring to FIGS. 1 and 8-10, method 100 includes a block 112 where inner spacer features 234 are formed. Operation at block 112 may include selective and partial removal of the sacrificial layers 206 to form inner spacer recesses 230 (shown in FIG. 8), deposition of inner spacer material over the workpiece 200 (shown in FIG. 9), and etch back the inner spacer material to form inner spacer features 234 in the inner spacer recesses 230 (shown in FIG. 10). Referring to FIG. 8, the sacrificial layers 206 exposed in the source/drain trench 228 are selectively and partially recessed to form inner spacer recesses 230 while the gate spacer layer 226, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 9:
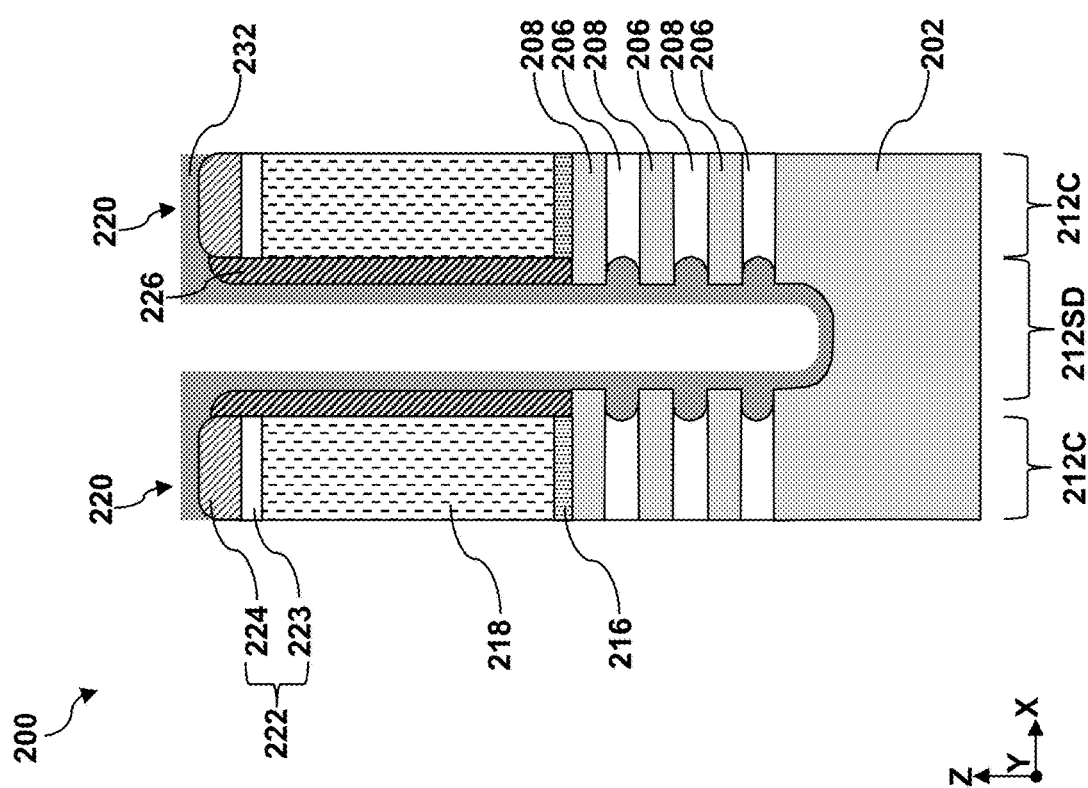
Figure 10:
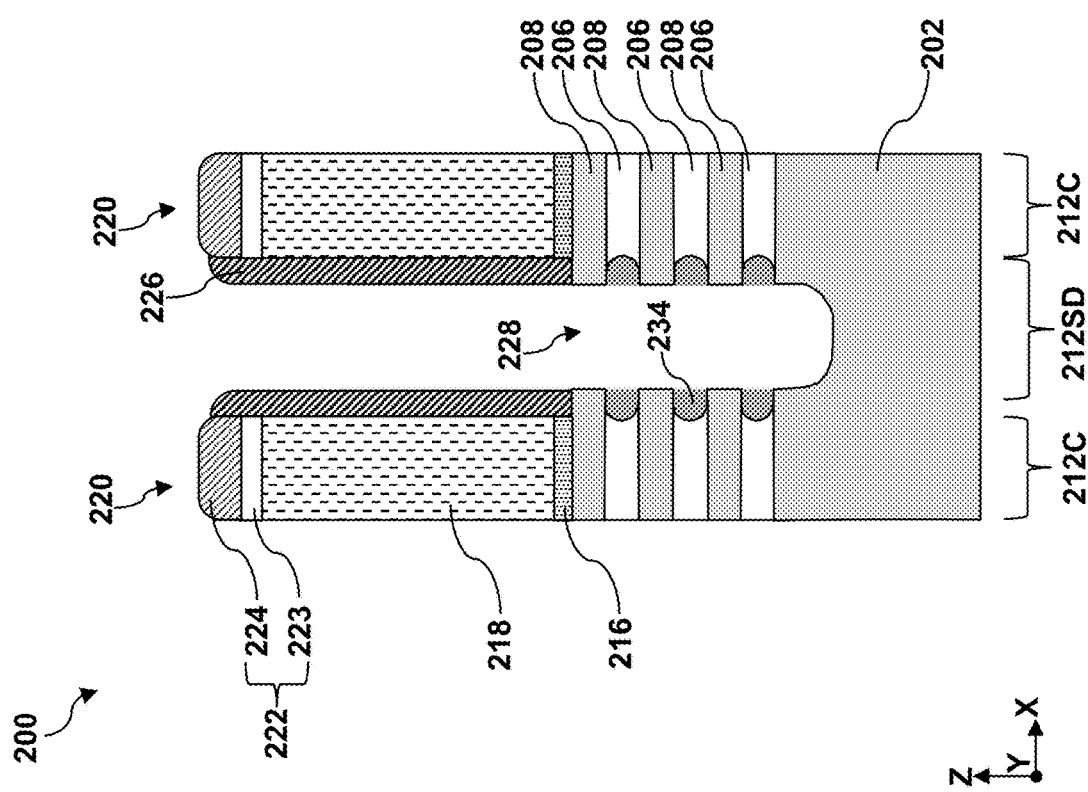

Referring to FIG. 9, after the inner spacer recesses 230 are formed, an inner spacer material 232 is deposited over the workpiece 200, including over the inner spacer recesses 230. The inner spacer material 232 may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material 232 may be a single layer or a multilayer. In some implementations, the inner spacer material 232 may be deposited using CVD, PECVD, SACVD, ALD or other suitable methods. The inner spacer material 232 is deposited into the inner spacer recesses 230 as well as over the sidewalls of the channel layers 208 exposed in the source/drain trenches 228. Referring to FIG. 10, the deposited inner spacer material 232 is then etched back to remove the inner spacer material from the sidewalls of the channel layers 208 to form the inner spacer features 234 in the inner spacer recesses 230. At block 112, the inner spacer material 232 may also be removed from the top surfaces and/or sidewalls of the gate-top hard mask layer 222 and the gate spacer layer 226. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 10, each of the inner spacer features 234 is in direct contact with the recessed sacrificial layers 206 and is disposed vertically (along the Z direction) between two neighboring channel layers 208.

While not explicitly shown, before any of the epitaxial layers are formed, method 100 may include a cleaning process to clean surfaces of the workpiece 200. The cleaning process may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and or hydrofluoric acid for oxide removal. The dry clean process may include helium (He) and hydrogen ($H_2$) treatment. The hydrogen treatment may convert silicon on the surface to silane ($SiH_4$), which may be pumped out for removal.

Figure 11:
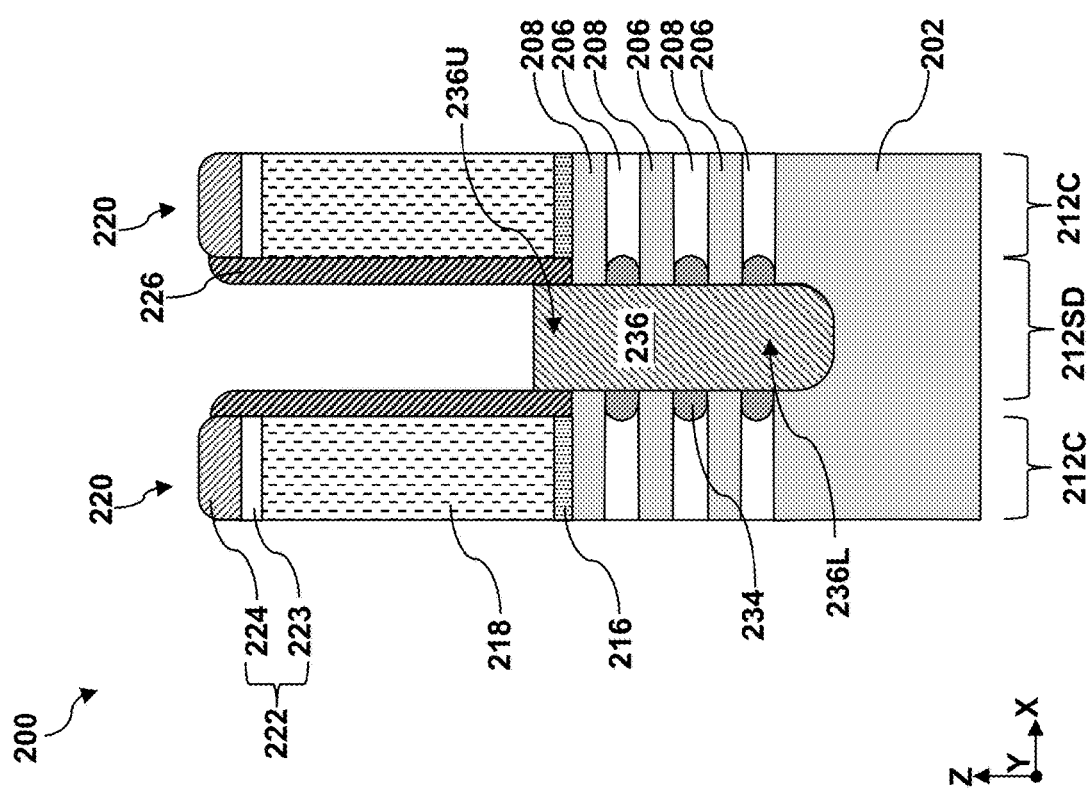

Referring to FIGS. 1 and 11, method 100 includes a block 114 where a source/drain feature 236 is formed in the source/drain trenches 228. In some embodiments, the source/drain feature 236 may be deposited using vapor-phase epitaxy (VPE), ultra-high vacuum CVD (UHV-CVD), molecular beam epitaxy (MBE), and/or other suitable processes. When the source/drain feature 236 is n-type, the source/drain feature 236 may include silicon (Si) doped with an n-type dopant, such as phosphorus (P) or arsenic (As). When the source/drain feature 236 is p-type, the source/drain feature 236 may include silicon germanium (SiGe) doped with a p-type dopant, such as boron (B) or boron difluoride ($BF_2$). In some alternative embodiments not explicitly shown in the figures, the source/drain features 236 may include multiple layers. In one example, a source/drain feature 236 may include an undoped semiconductor buffer layer disposed directly over the source/drain region 212SD, a lightly doped first epitaxial layer over the undoped semiconductor buffer layer, a heavily doped second epitaxial layer over the lightly doped first epitaxial layer, and a capping epitaxial layer disposed over the heavily doped second epitaxial layer. The undoped semiconductor buffer layer functions to reduce leakage through the bulk substrate 202. The first epitaxial layer has a lower dopant concentration and a smaller germanium content (when germanium is present) than the second epitaxial layer to reduce lattice mismatch defects. The second epitaxial layer has the highest dopant concentration and the highest germanium content (when germanium is present) to reduce resistance and increase strain on the channels. The capping epitaxial layer may have a smaller dopant concentration and germanium content than the second epitaxial layer to increase etch resistance.

As shown in FIG. 11, the source/drain feature 236 includes a lower portion 236L and an upper portion 236U disposed over the lower portion 236L. The lower portion 236L is disposed directly between channel layers 208 of two adjacent channel regions 212C along the X direction. The lower portion 236L is also disposed directly between the inner spacer features 234 in one of the channel region 212C and the inner spacer features 234 in an adjacent channel region 212C along the X direction. Because the source/drain trench 228 extends into the substrate 202, the source/drain feature 236 also extends into the substrate 202. In embodiments where the source/drain feature 236 includes an undoped semiconductor buffer layer, the undoped semiconductor buffer layer, which may be formed of silicon (Si), germanium (Ge), or silicon germanium (SiGe), may account for the portion that extends into the substrate 202. The upper portion 236U is disposed between two portion of the gate spacer layer 226 that are disposed along sidewalls of the two dummy gate stack 220. For ease of reference, the two portions of the gate spacer layer 226 may be referred to as a first gate spacer and a second gate spacer, even though they are two portions of the same gate spacer layer 226.

Figure 12:
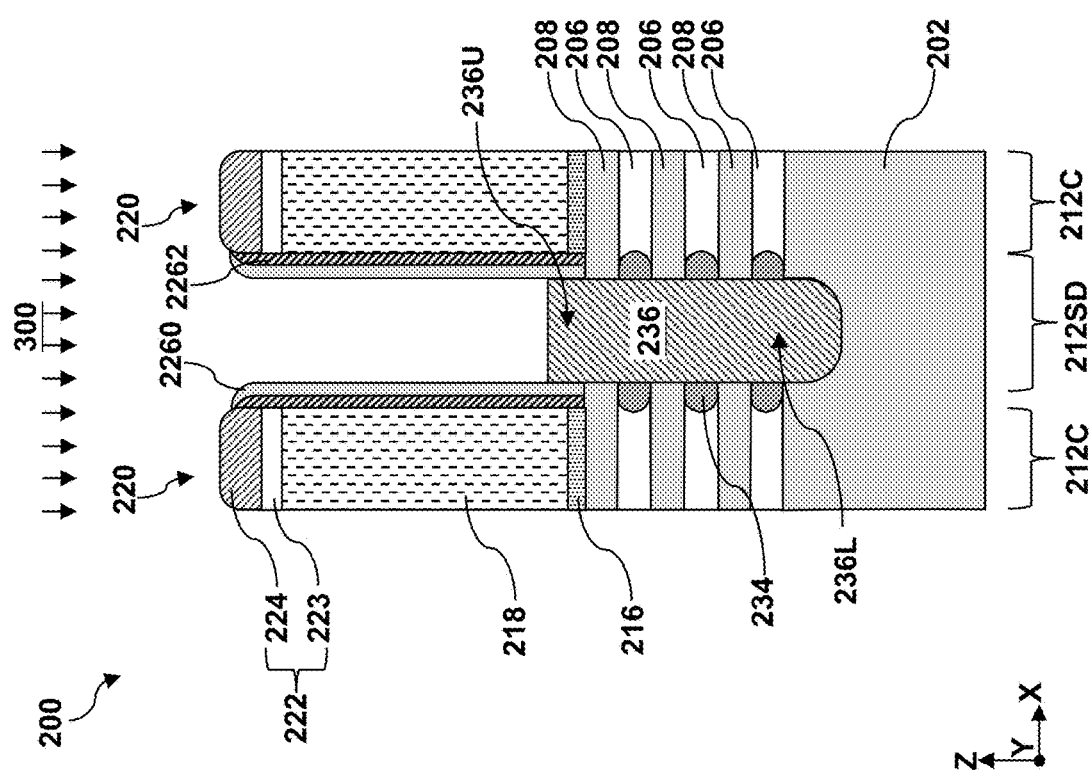

Referring to FIGS. 1 and 12, method 100 includes a block 116 where the gate spacer layer 226 is treated by a treatment 300 to break Si—C and Si—N bonding. In some embodiments, the treatment 300 may include use of hydrogen radical or oxygen radical that is generated remotely by a radical generator. In one embodiment, the treatment 300 uses remotely generated hydrogen radical. It is observed that the treatment 300 may break silicon-nitrogen (Si—N) bonding or silicon-carbon (Si—C) bonding of an outer portion of the gate spacer layer 226, thereby forming a treated outer portion 2260 and a substantially untreated inner portion 2262. In the embodiment where the gate spacer layer 226 is formed of silicon oxycarbonitride, the treated outer portion 2260 may be silicon-oxide-like as the Si—C bonding and the Si—N bonding therein are broken by the treatment 300. It is observed that the treatment 300 allows the treated outer portion 2260 to be removable by cleaning process configured to remove silicon oxide. The treatment 300 has similar effect on a gate spacer layer 226 that is formed of silicon oxycarbide or silicon oxynitride. When the treatment 300 breaks the Si—C bonding or the Si—N bonding, the treated silicon oxycarbide or treated silicon oxynitride may become silicon-oxide-like and may be removed using etch processes selective to silicon oxide. Depending on the energy of the remotely generated radical and the process temperature, the treatment 300 may have different treatment depth or penetration depth. Generally speaking, the treatment depth is greater when the radical is generated with higher energy or when the process temperature is higher, or both. In some embodiments represented in FIG. 12, the treatment 300 reaches the gate spacer layer 226 adjacent the sidewalls of the source/drain feature 236. In some alternative embodiments, the treatment 300 has a smaller treatment depth and the treated outer portion 2260 may not extend below a top surface of the source/drain feature 236. The gate-top hard mask layer 222 functions to protect the dummy gate stacks 220 during the treatment 300 at block 116.

Figure 13:
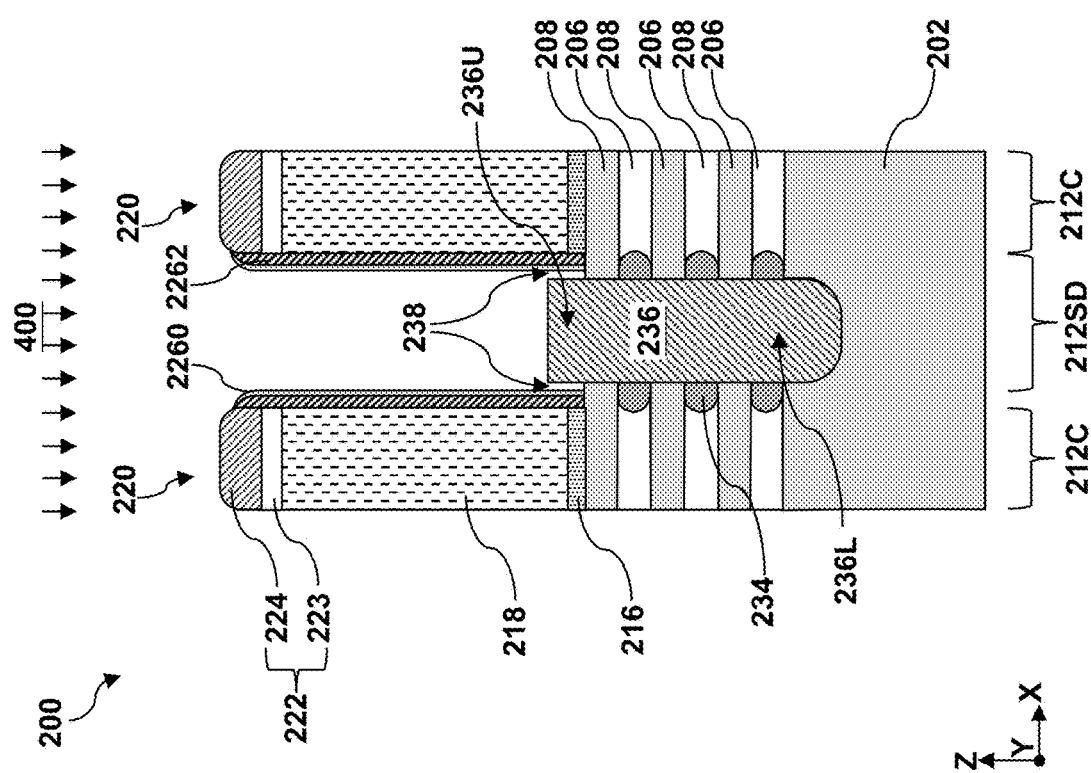

Referring to FIGS. 1 and 13, method 100 includes a block 118 where a cleaning process 400 is performed. In some embodiments, the cleaning process 400 may include use of buffered oxide etch (BOE) solution or diluted hydrofluoric acid (DHF). The BOE solution may include hydrofluoric acid (HF) and ammonium fluoride (NH$_4$F). The cleaning process 400 may include a process temperature between about 25° C. and about 80° C. The cleaning process 400 is configured to selectively etch the treated outer portion 2260 without causing substantial damages to the untreated inner portion 2262. In the depicted embodiments, the cleaning process 400 is configured to selectively remove silicon oxide or the silicon-oxide-like treated outer portion 2260. Depending on the cleaning solution selected, process temperature, and process time, the treated outer portion 2260 may or may not be completely removed. In the embodiments represented in FIG. 13, the treated outer portion 2260 is only trimmed to a smaller thickness but is not entirely removed. The trimming of the treated outer portion 2260 may result in slits 238. Each of the slits 238 is defined between a lower sidewall of the treated outer portion 2260 and the upper portion 236U.

Although not explicitly shown in the figures, operations at blocks 116 and 118 may be integrated as a controlled removal process that includes multiple cycles. Each of the cycles include a treatment 300 and a cleaning process 400. The cycles may or may not have the same process time or the same process temperature to suit different process needs.

Figure 14:
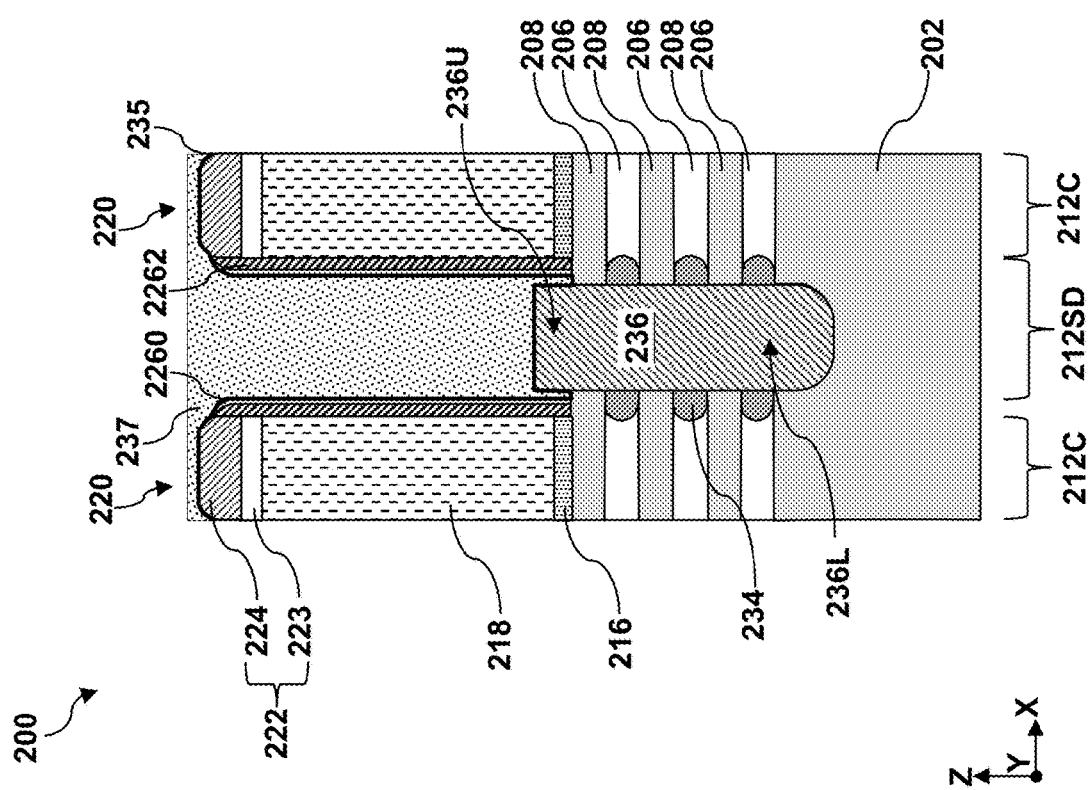
Figure 15:
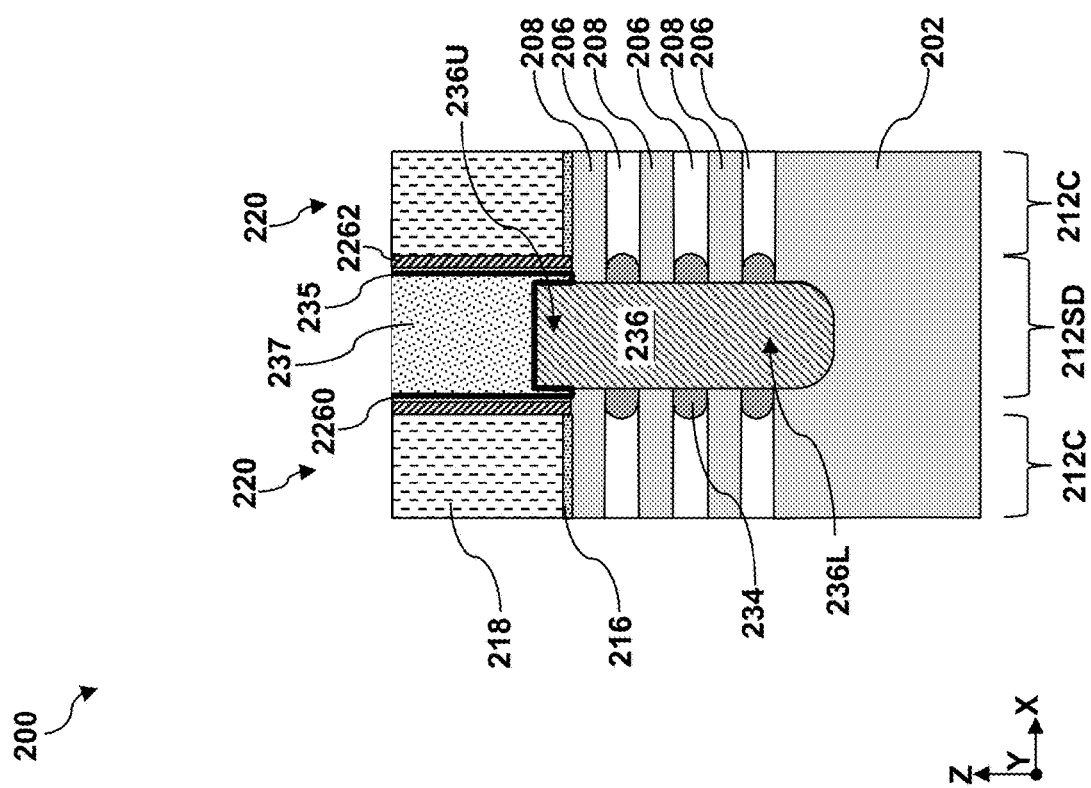

Referring to FIGS. 1 and 14-18, method 100 includes a block 120 where the dummy gate stacks 220 are replaced with gate structures 250. Block 120 may include deposition of a contact etch stop (CESL) layer 235 an interlayer dielectric (ILD) layer 237 over the workpiece 200 (shown in FIG. 14), planarization of the workpiece 200 (shown in FIG. 15), removal of the dummy gate stack 220 (shown in FIG. 16), selective removal of the sacrificial layers 206 in the channel regions 212C to release the channel layers 208 as channel members 2080 (shown in FIG. 17), and formation of the gate structure 250 to wrap around each of the channel members 2080 (shown in FIG. 18). Referring to FIGS. 1 and 14, block 120 deposits the CESL 235 and the ILD layer 237 over the workpiece 200. The CESL 235 is deposited prior to deposition of the ILD layer 237. In some examples, the CESL 235 includes silicon nitride, silicon oxynitride, and/or other materials known in the art. The CESL 235 may be formed using ALD, plasma-enhanced chemical vapor deposition (PECVD) and/or other suitable deposition processes. The ILD layer 237 is then deposited over the CESL 235. In some embodiments, the ILD layer 237 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 237 may be deposited by a PECVD process or other suitable deposition technique. In some embodiments, after formation of the ILD layer 237, the workpiece 200 may be annealed to improve integrity of the ILD layer 237. As shown in FIGS. 14, the CESL 235 may be disposed directly on the top surface of the source/drain feature 236. Referring to FIG. 15, after the deposition of the CESL 235 and the ILD layer 237, the workpiece 200 may be planarized by a planarization process to expose the dummy gate stack 220. For example, the planarization process may include a chemical mechanical planarization (CMP) process.

Figure 16:
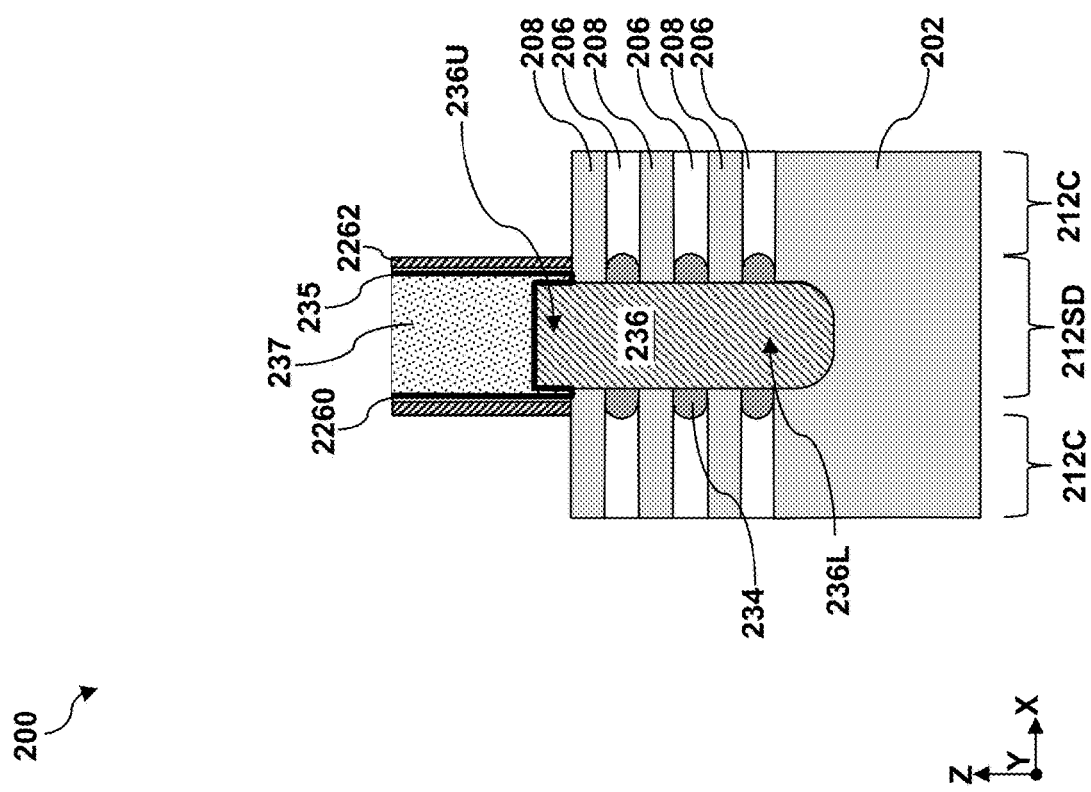
Figure 17:
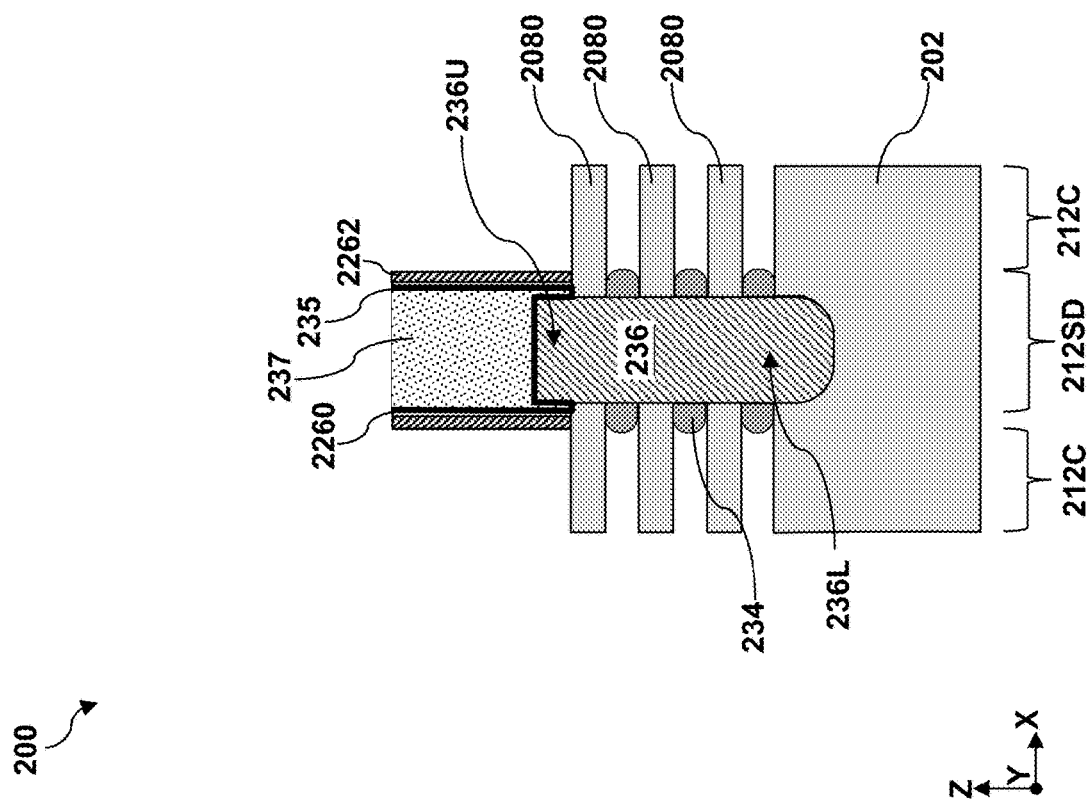

With the dummy gate stacks 220 exposed, block 120 proceeds to remove the dummy gate stacks 220 shown in FIG. 16. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212C are exposed. Referring to FIG. 17, the sacrificial layers 206 between the channel layers 208 in the channel regions 212C are then selectively removed. The selective removal of the sacrificial layers 206 releases the channel layers 208 (shown in FIG. 16) to form channel members 2080 shown in FIG. 17. The selective removal of the sacrificial layers 206 forms a gate trench that includes spaces between adjacent channel members 2080.

The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 18:
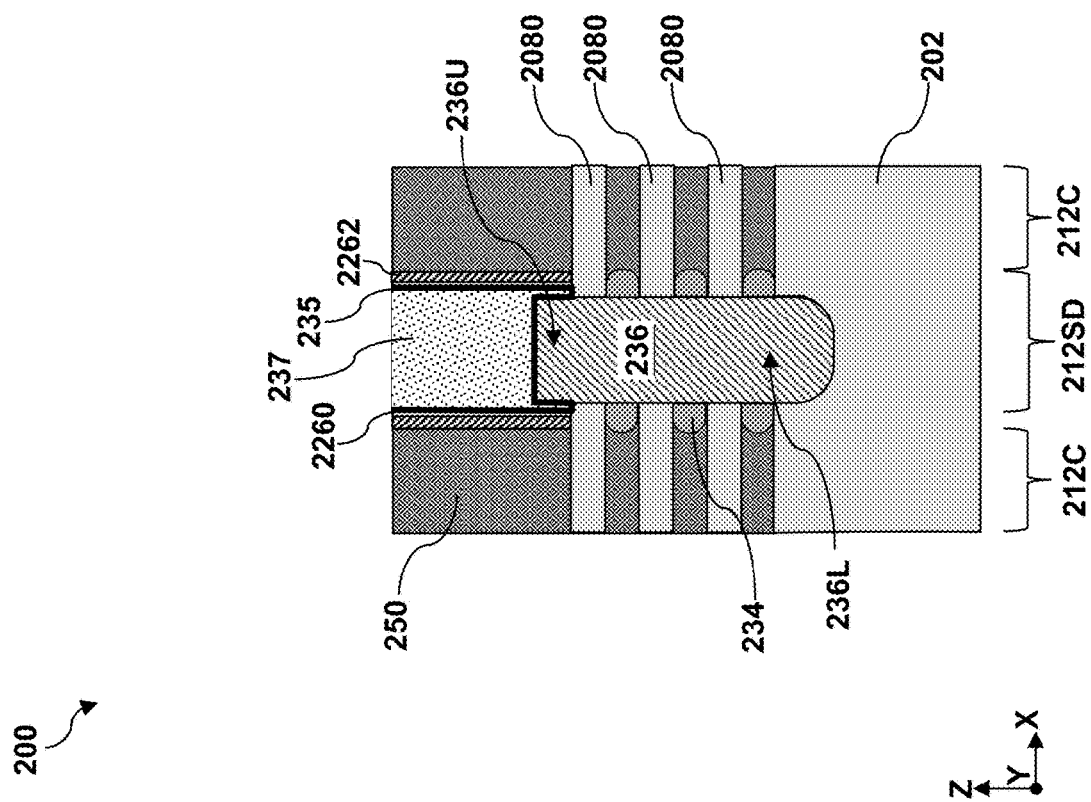

Referring to FIG. 18, after the release of the channel members 2080, the gate structure 250 is formed to wrap around each of the channel members 2080. While not explicitly shown, the gate structure 250 includes an interfacial layer interfacing the channel members 2080 and the substrate 202 in the channel region 212C, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structure. The gate structure includes portions that interpose between channel members 2080 in the channel region 212C.

Figure 19:
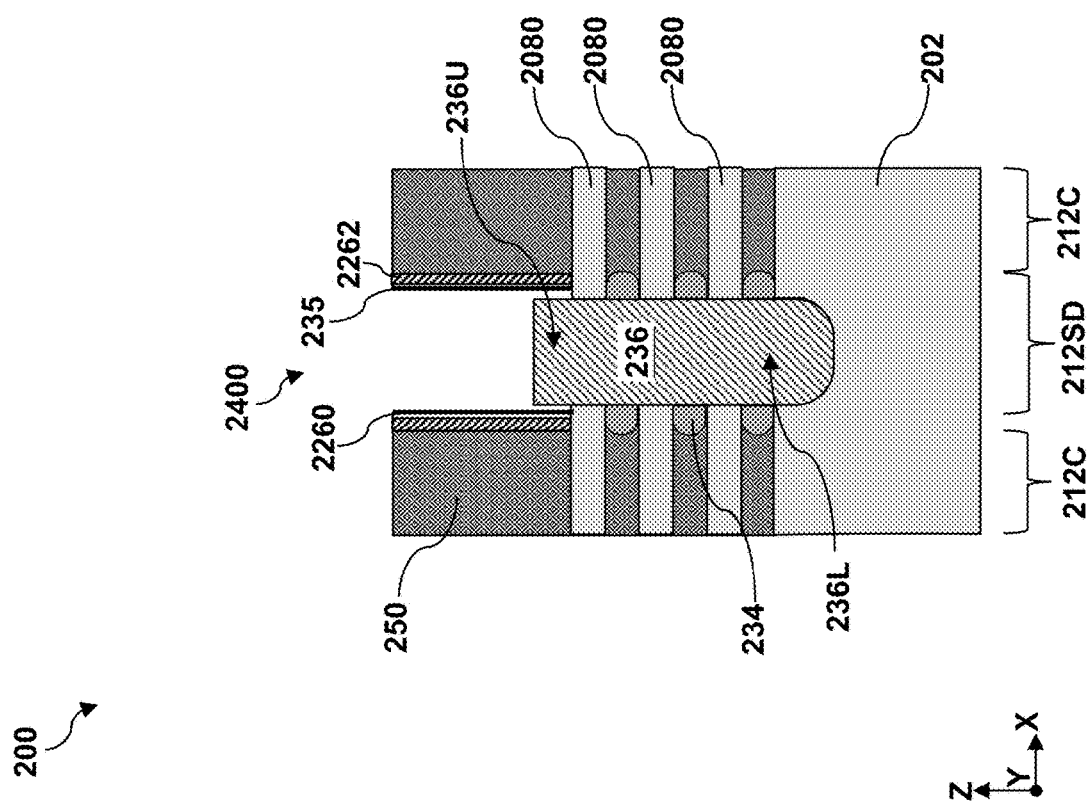
Figure 20:
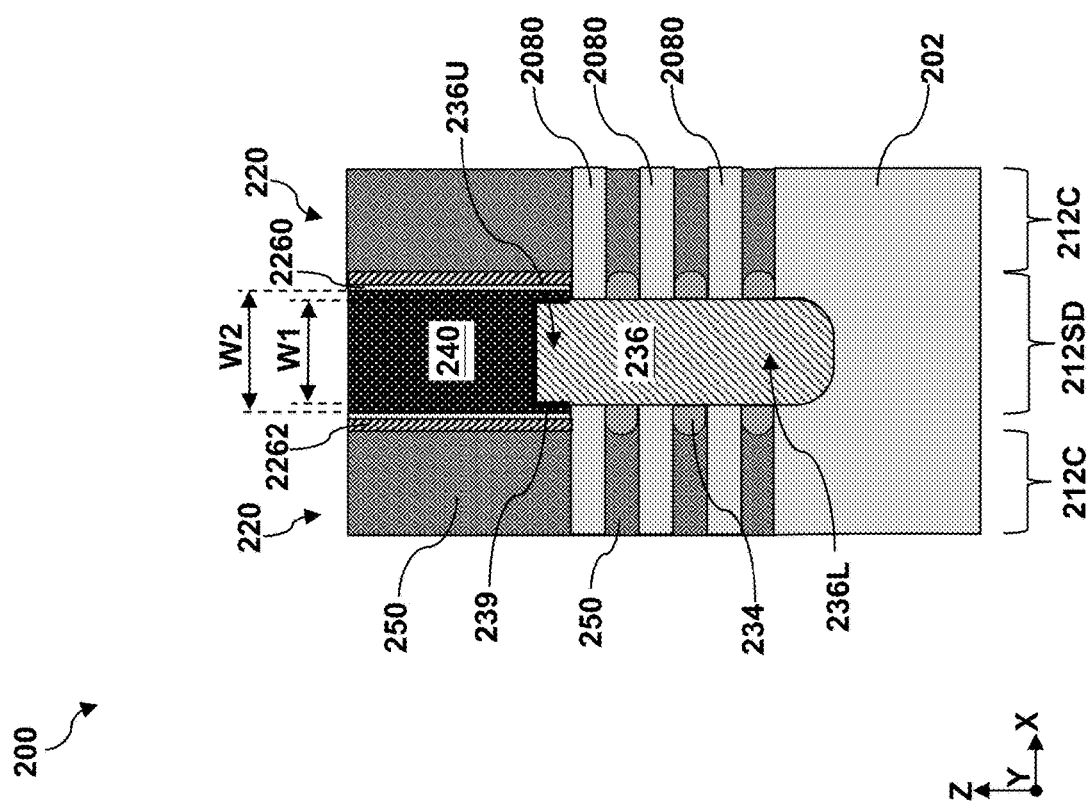

Referring to FIGS. 1, 19 and 20, method 100 includes a block 122 where a contact plug 240 is formed over the source/drain feature 236. Operations at block 122 include forming a contact opening 2400 (shown in FIG. 19) over the source/drain feature 236, forming a silicide feature 239 over exposed surfaces of the source/drain feature 236 (shown in FIG. 20), and forming the contact plug 240 over the silicide feature 239. The formation of the contact opening 2400 may include etching of the ILD layer 237 and the CESL 235. The etching may be performed using a dry etch process, a wet etch process, or a combination thereof. In some embodiments, the etching of the ILD layer 237 and the CESL 235 is self-aligned through one or more selective etching steps and does not require additional photolithography operation. For example, a first etch process may be performed to selectively remove the ILD layer 237 and a second etch process may be performed to selectively remove the CESL 235. Because the ILD layer 237 may include silicon oxide, the first etch process may include use of diluted hydrofluoric acid (DHF) or buffered oxide etch (BOE), which includes a mixture of hydrofluoric acid and ammonium fluoride. Because the CESL 235 may include silicon nitride, the second etch process may include use phosphoric acid ($H_3PO_4$). As shown in FIG. 19, after the etching of the ILD layer 237 and the CESL 235, surfaces of the upper portion 236U of the source/drain feature 236 are exposed in the contact opening 2400. In the depicted embodiments, the etching of the ILD layer 237 and the CESL 235 is performed using an anisotropic etch process. As a result, as shown in FIG. 19, sidewalls of the treated outer portion 2260 may remain covered by the CESL 235. Additionally, a portion of the topmost channel member 2080 may be exposed after the etching of the ILD layer 237 and the CESL 235.

In some embodiments represented in FIG. 19, the silicide feature 239 may be formed over the exposed surfaces of the upper portion 236U of the source/drain feature 236 before the formation of the contact plug 240 to reduce contact resistance. The silicide feature 239 may be formed by depositing a precursor metal over the source/drain feature 236, annealing the workpiece 200 to bring about silicidation between the source/drain feature 236 and the precursor metal, and removing unreacted precursor metal from the workpiece 200. In some instances, the silicide feature may include titanium silicide, tantalum silicide, cobalt silicon, tungsten silicon, or other transition metal silicide. A portion of the silicide feature 239 may extend into the slits 238 (shown in FIG. 13) such that the portion of the silicide feature 239 is disposed between the untreated inner portion 2262 and the upper portion 236U of the source/drain feature 236.

Referring to FIG. 20, after the formation of the contact opening 2400, a metal is deposited over the workpiece 200, including over the source/drain feature 236, using physical vapor deposition (PVD), metalorganic CVD (MOCVD), or bottom-up deposition. In some embodiments, the metal deposited at block 122 may include cobalt (Co), nickel (Ni), ruthenium (Ru), or a combination thereof. After the deposition of the metal, the workpiece 200 is planarized using, for example, a CMP process to form the contact plug 240 shown in FIG. 20. In one embodiment, the contact plug 240 is formed of cobalt (Co). In the depicted embodiments, due to the formation of the slits 238 (shown in FIG. 13), portions of the contact plug 240 extends between the treated outer portion 2260 and the upper portion 236U of the source/drain feature 236.

Reference is still made to FIG. 20. Due to the trimming of the gate spacer layer 226, a first width W1 of the source/drain feature 236 along the X direction is smaller than the second width W2 of the contact plug 240. In some instances, the first width W1 is between about 15 nm and about 25 nm and the second width W2 is between about 20 nm and about 30 nm. The residual treated outer portion 2260 has a thickness between about 1 nm and about 3 nm.

Variation of thicknesses of the gate spacer layer 226 and the penetration depth of the treatment 300 may give rise to various different embodiments shown in FIGS. 21-33.

Figure 21:
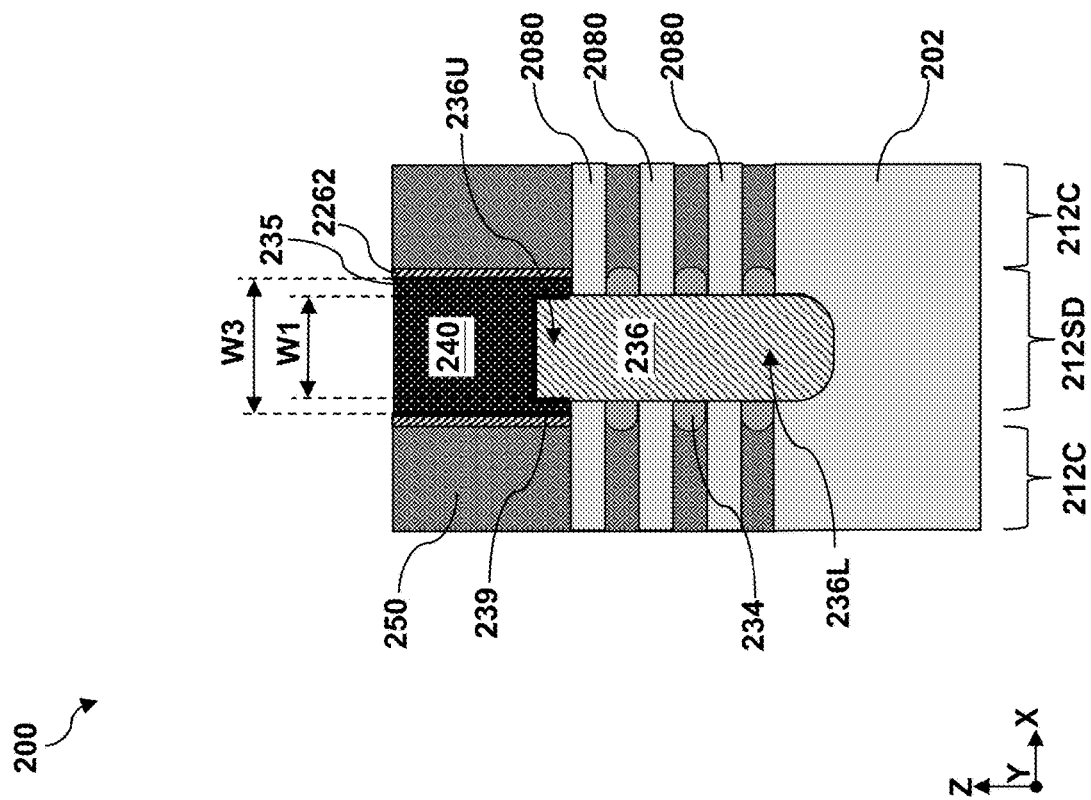

FIG. 21 illustrates an embodiment where the treated outer portion 2260 is completely removed by the cleaning process at block 118. In this embodiment, due to complete removal of the treated outer portion 2260, the slits 238 shown in FIG. 13 would be wider along the X direction, which is the gate length direction. As shown in FIG. 21, because of the complete removal of the treated outer portion 2260, the lower portions of the contact plug 240 is sandwiched directly between the upper portion 236U of the source/drain feature 236 and the untreated inner portion 2262 of the gate spacer layer 226. In the embodiment depicted in FIG. 21, while the source/drain feature 236 still has the first width W1 as similarly shown in FIG. 20 and the contact plug 240 has a third width W3, which is greater than the second width W2. In some instances, the third width W3 is between about 22 nm and about 36 nm.

Figure 22:
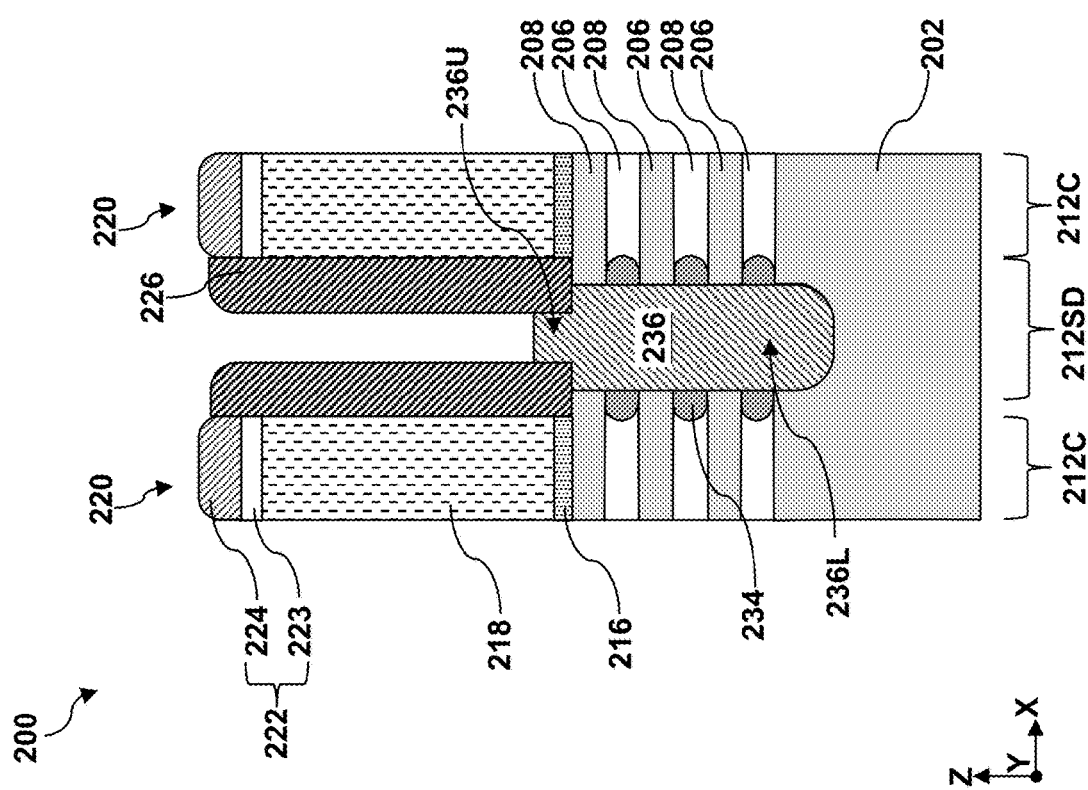
Figure 23:
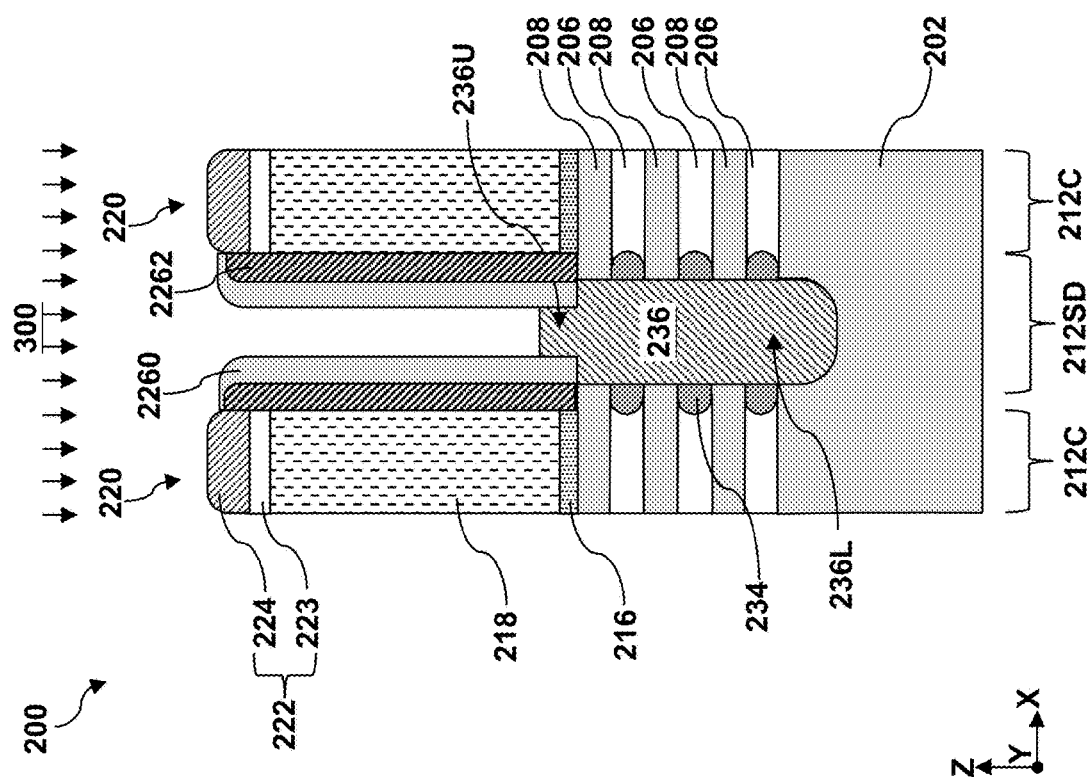
Figure 24:
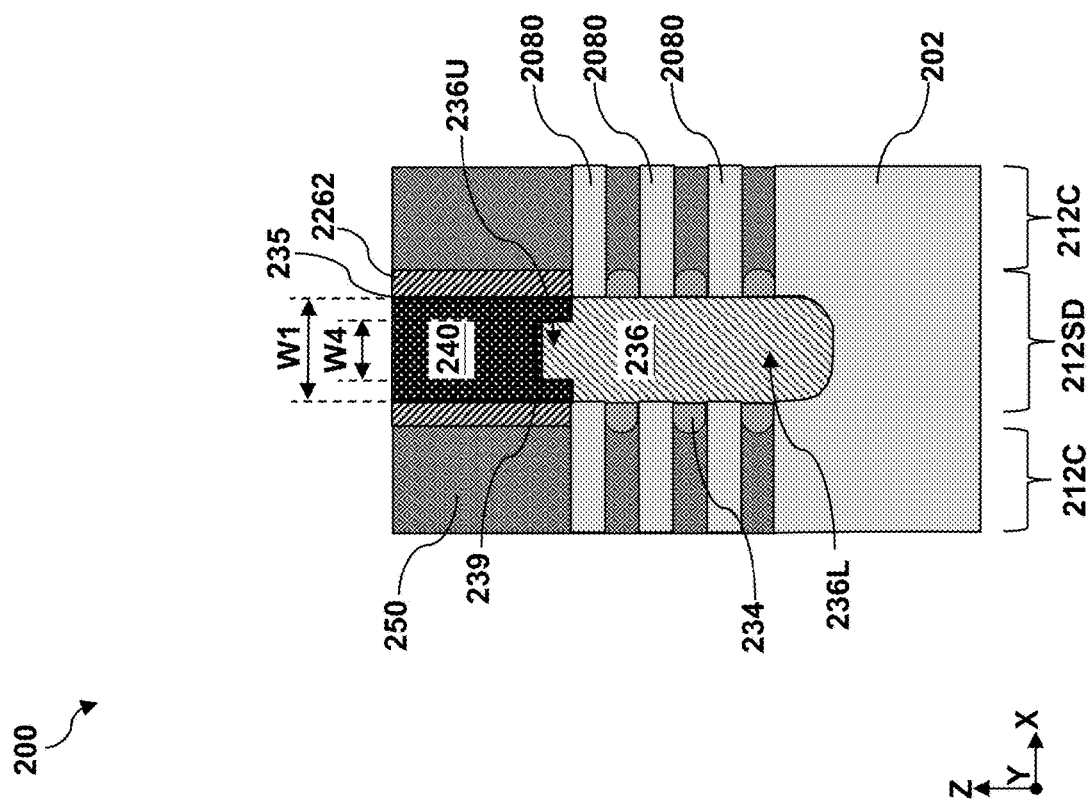

FIGS. 22-24 illustrate an embodiment where a thickness of the gate spacer layer 226 is such that a portion of the gate spacer layer 226 extends over the source/drain feature 236. In some instances, the workpiece 200 received at block 102 of method 100 includes gate spacer layer 226 that partially overhangs the topmost channel layers 208 as shown in FIG. 22. The overhanging of the thicker gate spacer layer 226 may be resulted when the recessing of the source/drain region of the fin-shaped structure 212 is performed using a combination of an isotropic dry etch process, such as RIE and an isotropic etch process such as an APM etch (e.g., ammonia hydroxide-hydrogen peroxide-water mixture). Because the deposition of the source/drain feature 236 is selective to semiconductor surfaces, such as sidewalls of the channel layers 208 and sacrificial layers 206, the source/drain feature 236 may be deposited over sidewalls of the channel layers 208 and sacrificial layers 206 below the gate spacer layer 226. As a result, the upper portion 236U of the source/drain feature is narrower than the lower portion 236L. FIG. 23 schematically illustrates how the thicker gate spacer layer 226 undergoes the treatment 300 at block 116. Because the treated outer portion 2260 is disposed directly over a portion of the lower portion 236L, in embodiments where the treated outer portion 2260 is completely removed, the slits 238 so formed extend along sidewalls of the upper portion 236U and is situation directly over a portion of the lower portion 236L. In some embodiments represented in FIG. 24, the contact plug 240 and the lower portion 236L may have the first width W1, while the upper portion 236U has a smaller fourth width W4. In some instances, the fourth width W4 is between about 12 nm and about 20 nm. While not explicitly shown in the figures, the contact plug 240 in FIG. 24 may have a greater or smaller width than the lower portion 236L of the source/drain feature 236 in some alternative embodiments. In FIG. 24, a portion of the silicide feature 239 may extend into the slits 238 such that the portion of the silicide feature 239 is disposed between the untreated inner portion 2262 and the upper portion 236U of the source/drain feature 236.

Figure 25:
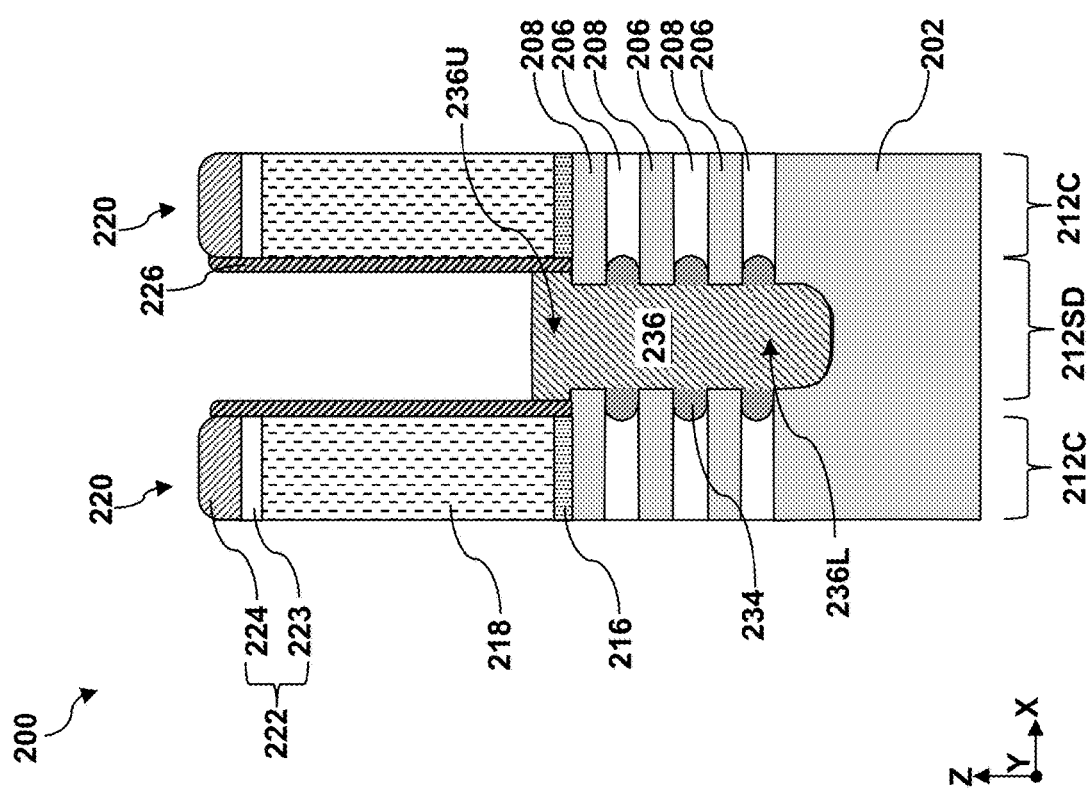
Figure 26:
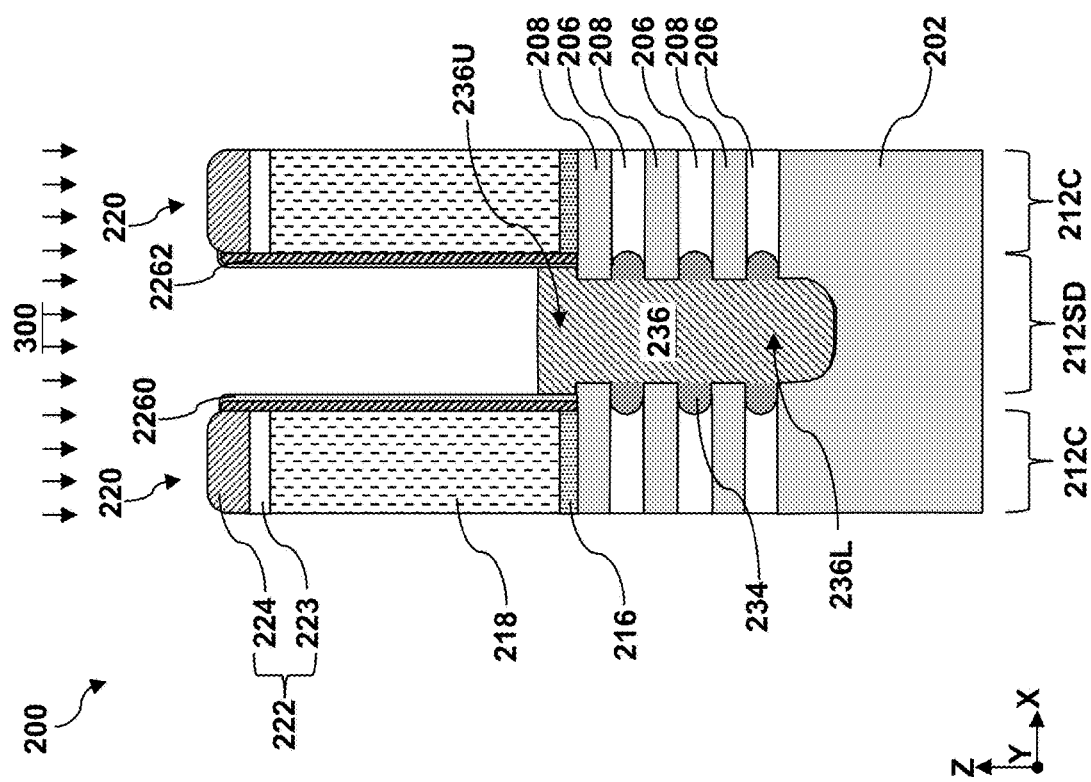
Figure 27:
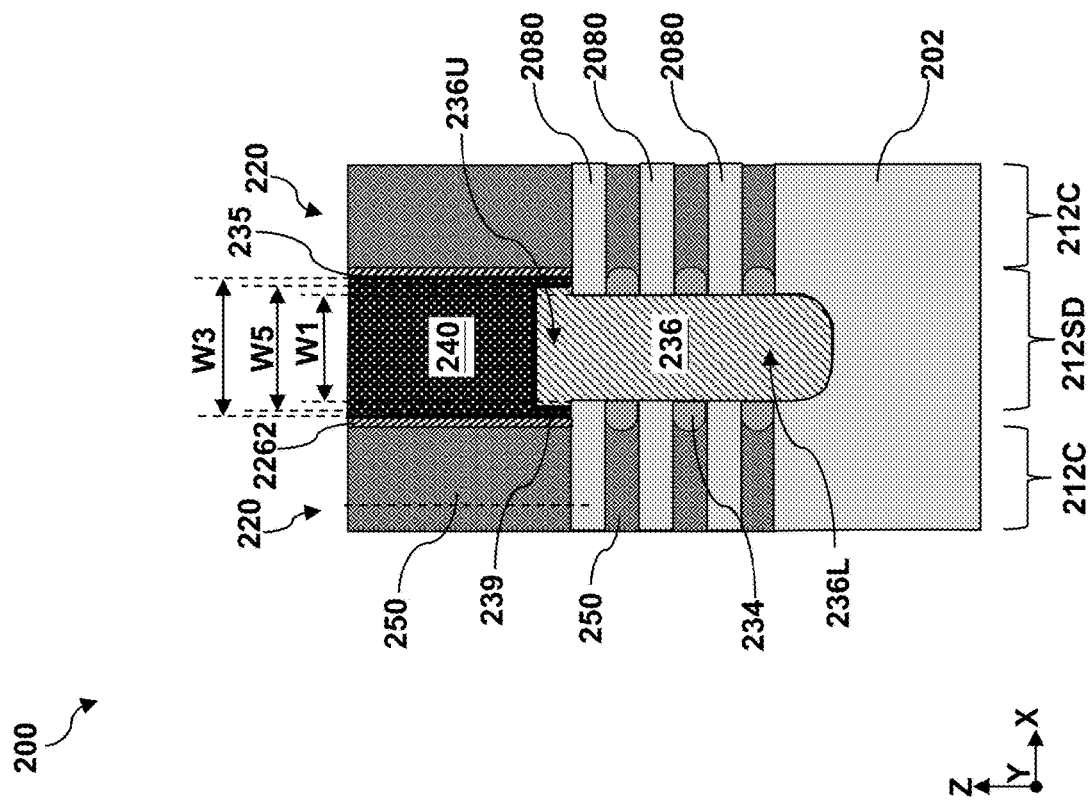

FIGS. 25-27 illustrate an embodiment where a thickness of the gate spacer layer 226 is such that the upper portion 236U of the source/drain feature 236 overhangs the topmost channel members 2080. As shown in FIG. 25, in this embodiment, the upper portion 236U has a width greater than that of the lower portion 236L. This configuration may be formed when the dry etching that recesses the source/drain region of the fin-shaped structure 212 etches the gate spacer layer 226 faster than it etches the sacrificial layers 206 and channel layers 208. FIG. 26 schematically illustrates how the thinner gate spacer layer 226 undergoes the treatment 300 at block 116. FIG. 27 illustrates the workpiece 200 where the treated outer portion 2260 shown in FIG. 26 is completely removed and the contact plug 240 is formed over the source/drain feature 236. As shown in FIG. 27, the lower portion 236L has the first width W1, the upper portion 236U has a fifth width W5 greater than the first width W1, and the contact plug 240 has the third width W3 greater than the fifth width W5. In some instances, the fifth width W5 is between about 18 nm and about 30 nm. In FIG. 27, a portion of the silicide feature 239 may extend into the slits 238 such that the portion of the silicide feature 239 is disposed between the untreated inner portion 2262 and the upper portion 236U of the source/drain feature 236.

Figure 28:
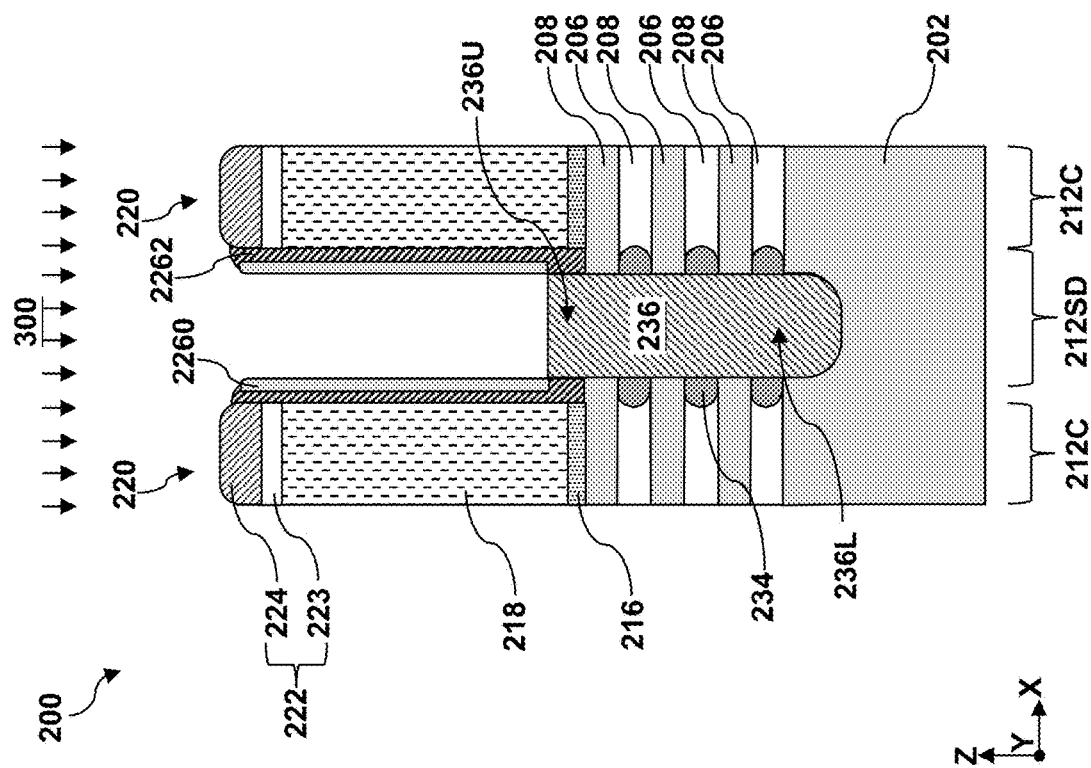
Figure 29:
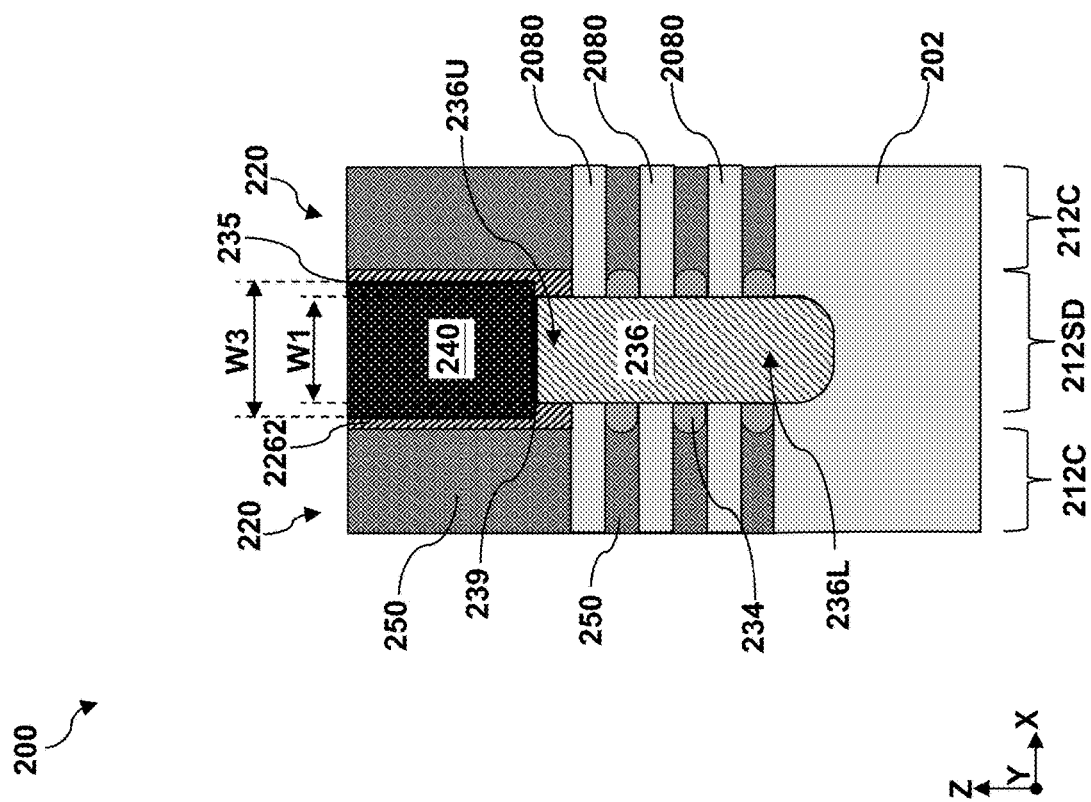

FIGS. 28-29 illustrate an embodiment where the treatment depth of the treatment 300 does not extend substantially below a top surface of the source/drain feature 236. As described above with respect to block 116, depending on the energy of the radical and the treatment temperature, the treatment 300 may not effectively treat the outer portion of the gate spacer layer 226 below the top surface of the source/drain feature 236, as shown in FIG. 28. In those instances, the treated outer portion 2260 does not substantially extend below a level coplanar with the top surface of the source/drain feature 236. It can be seen that, after the treated outer portion 2260 shown in FIG. 28 is removed at block 122, no slits 238 would be formed. After the contact plug 240 is formed over the source/drain feature 236, no portions of the contact plug 240 extend between the sidewalls of the upper portion 236U and the untreated inner portion 2262, as shown in FIG. 29. In the embodiments represented in FIG. 29, the source/drain feature 236 has the first width W1 and the contact plug 240 has the third width W3.

Figure 30:
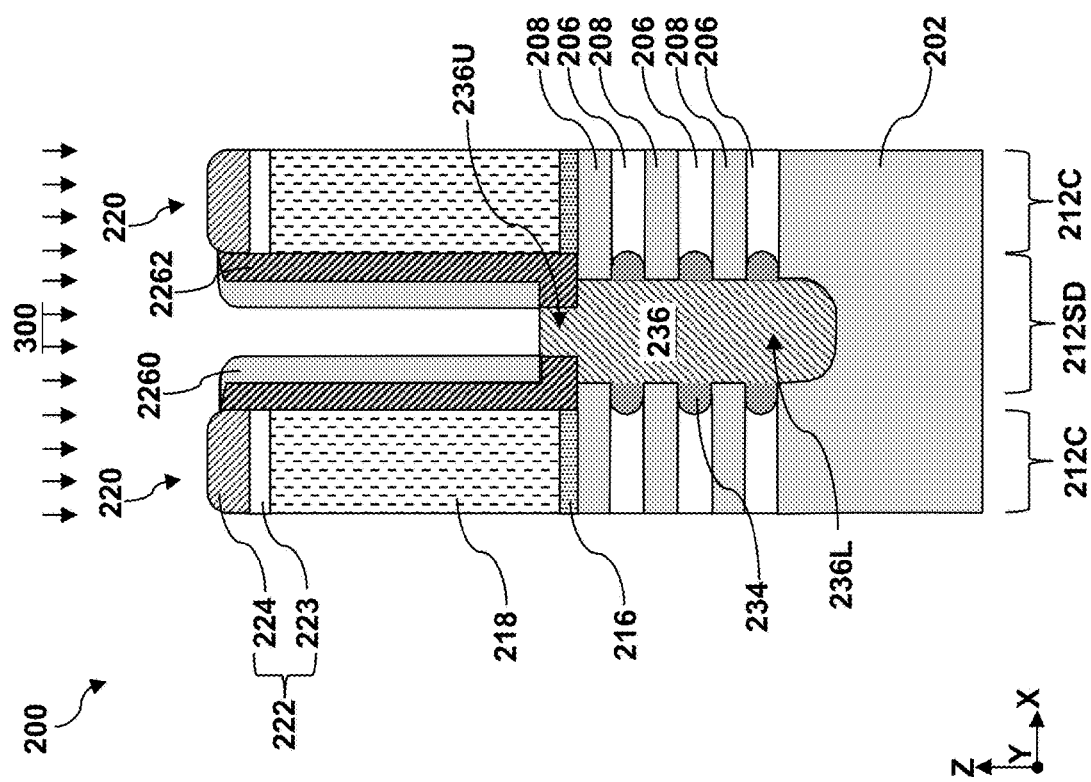
Figure 31:
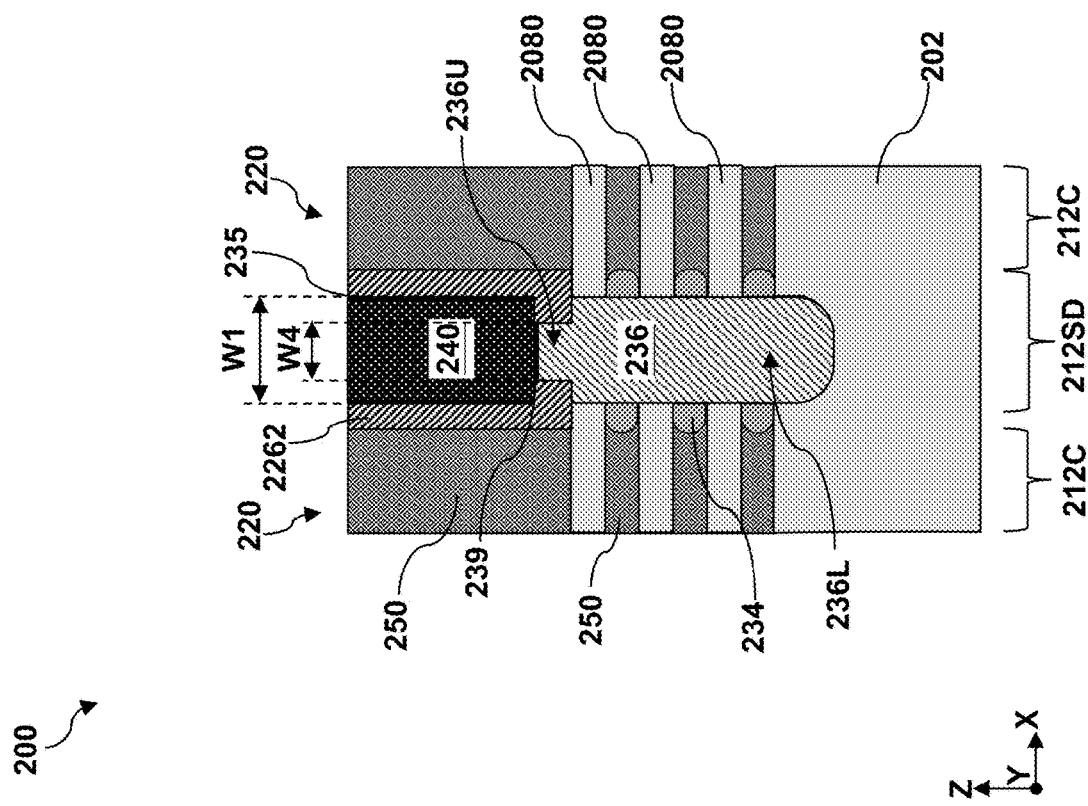

FIGS. 30-31 illustrate an embodiment where the treatment depth of the treatment 300 does not extend substantially below a top surface of the source/drain feature 236 and a thickness of the gate spacer layer 226 is such that a portion of the gate spacer layer 226 extends over the source/drain feature 236. The embodiment illustrated in FIG. 30-31 is different from the embodiment illustrated in FIGS. 22-24 in that the treatment 300 does not treat the outer portion of the gate spacer layer 226 below the top surface of the upper portion 236U of the source/drain feature 236, as illustrated in FIG. 30. As shown in FIG. 31, the lower portion 236L has the first width W1, the upper portion 236U has the smaller fourth width W4, and the contact plug 240 has the first width W1. Different from the embodiment shown in FIG. 24, no portions of the contact plug 240 extend downward between the upper portion 236U and the untreated inner portion 2262. While not explicitly shown in the figures, the contact plug 240 in FIG. 31 may have a greater or smaller width than the lower portion 236L of the source/drain feature 236 in some alternative embodiments. In FIG. 31, the silicide feature 239 does not between the untreated inner portion 2262 and the upper portion 236U of the source/drain feature 236.

Figure 32:
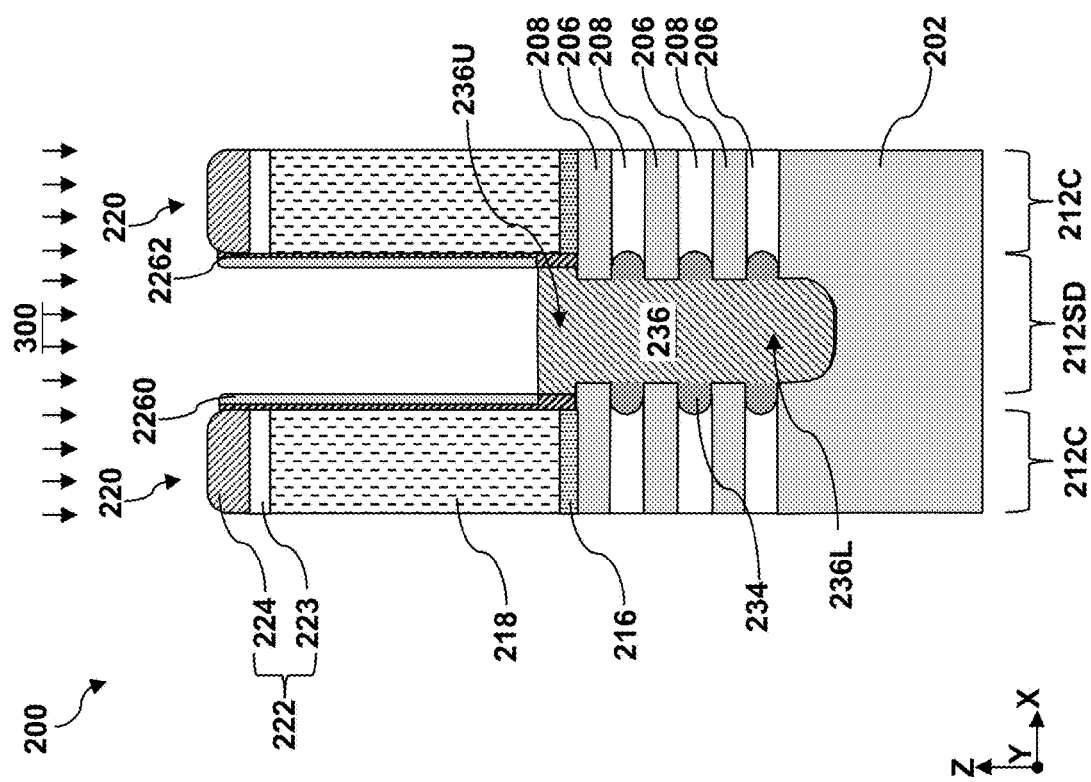
Figure 33:
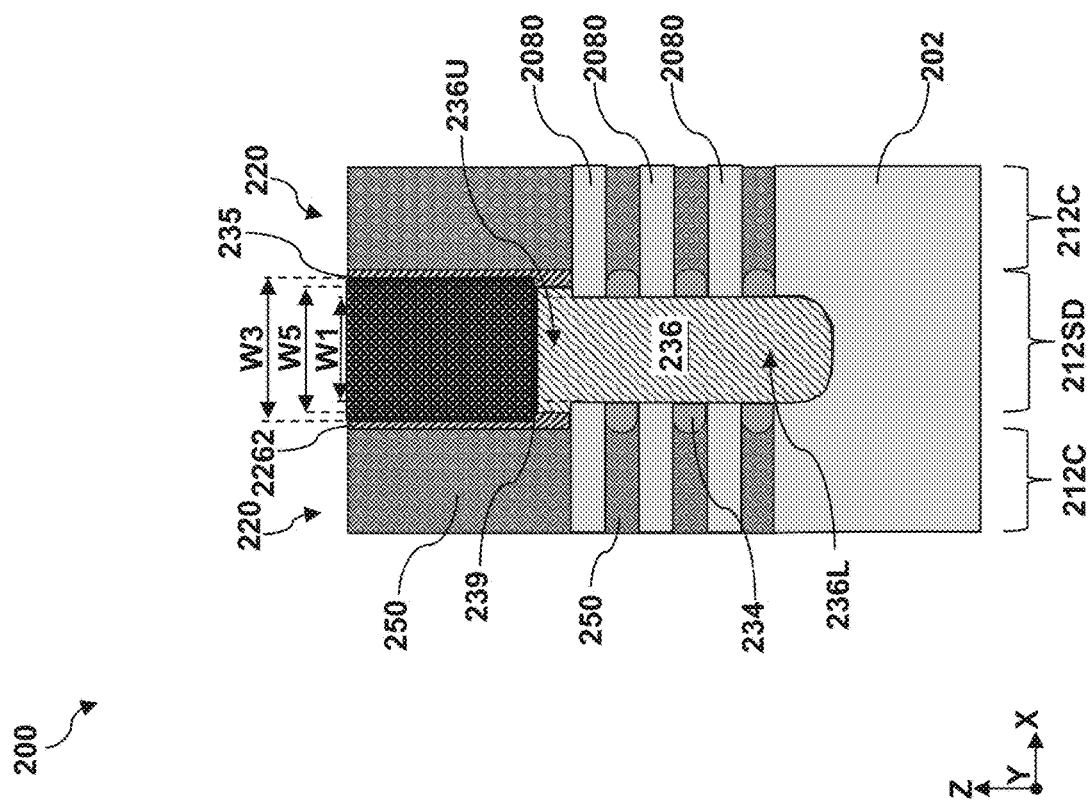

FIGS. 32-33 illustrate an embodiment where the treatment depth of the treatment 300 does not extend substantially below a top surface of the source/drain feature 236 and a thickness of the gate spacer layer 226 is such that a portion of the source/drain feature 236 overhangs the topmost channel members 2080. The embodiment illustrated in FIG. 32-33 is different from the embodiment illustrated in FIGS. 25-27 in that the treatment 300 does not treat the outer portion of the gate spacer layer 226 below the top surface of the upper portion 236U of the source/drain feature 236, as illustrated in FIG. 32. As shown in FIG. 33, the lower portion 236L has the first width W1, the upper portion 236U has the fifth width W5, and the contact plug 240 has the third width W3. Different from the embodiment shown in FIG. 27, no portions of the contact plug 240 extend downward between the upper portion 236U and the untreated inner portion 2262. In FIG. 33, the silicide feature 239 does not between the untreated inner portion 2262 and the upper portion 236U of the source/drain feature 236.

Although not intended to be limiting, one or more embodiments of the present disclosure provide many benefits to a semiconductor device and the formation thereof. For example, embodiments of the present disclosure use a combination of a treatment and a cleaning process to trim the gate spacer layer with a controlled precision. The trimming of the gate spacer layer widens the source/drain contact opening and reduces the aspect ratio thereof. As a result, methods of the present disclosure may eliminate or reduce voids or gaps in the contact plug formed over the source/drain feature, thereby reducing the contact resistance.

In one exemplary aspect, the present disclosure is directed to a method. The method includes receiving a workpiece that includes a first dummy gate structure disposed over a first active region, a second dummy gate structure disposed over a second active region, a first gate spacer extending along a sidewall of the first dummy gate structure and disposed at least partially over a top surface of the first active region, a second gate spacer extending along a sidewall of the second dummy gate structure and disposed at least partially over a top surface of the second active region, a source/drain feature having a lower portion disposed between the first active region and the second active region and an upper portion disposed between the first gate spacer and the second gate spacer. The method further includes treating a portion of the first gate spacer and a portion of the second gate spacer with a remote radical of hydrogen or oxygen, removing the treated portion of the first gate spacer and the treated portion of the second gate spacer, and after the removal, depositing a metal fill material over the source/drain feature and between the first gate spacer and the second gate spacer.

In some embodiments, the first gate spacer and the second gate spacer include silicon oxycarbide, silicon oxynitride, or silicon oxycarbonitride. In some implementations, the treating includes use of hydrogen radical or oxygen radical. In some instances, the removing includes use of hydrogen fluoride. In some embodiments, the metal fill material includes cobalt. The method may further include after the depositing of the metal fill material, planarizing the workpiece to form a contact plug over the source/drain feature. In some embodiments, each of the first active region and the second active region includes a plurality of nanostructures disposed one over another. In some instances, the method may further include after the removing, depositing a contact etch stop layer (CESL) disposed over source/drain feature, and depositing a dielectric layer over the CESL. In some implementations, the method may further include replacing the first dummy gate structure and the second dummy gate structure with a first metal gate structure and a second metal gate structure, respectively.

In another exemplary aspect, the present disclosure is directed to a method. The method includes receiving a workpiece that includes a first polysilicon gate structure disposed over a first plurality of nanostructures, a second polysilicon gate structure disposed over a second plurality of nanostructures, a first gate spacer extending along a sidewall of the first poly silicon gate structure, a second gate spacer extending along a sidewall of the second polysilicon gate structure, a source/drain feature having a lower portion disposed between the first plurality of nano structures and the second plurality of nanostructures along a direction and an upper portion disposed between the first gate spacer and the second gate spacer along the direction. The method further includes etching an outer portion of the first gate spacer and an outer portion of the second gate spacer, wherein the etching includes treating the first gate spacer and the second gate spacer with a remote radical of hydrogen or oxygen to convert the outer portion of the first gate spacer into a first treated portion and the outer portion of the second gate spacer into a second treated portion, and at least partially removing the first treated portions and the second treated portion. The method further includes, after the etching, forming a metal plug over the source/drain feature and between the first gate spacer and the second gate spacer.

In some embodiments, the etching exposes a portion of a topmost nanostructure of the first plurality of nanostructures and a portion of a topmost nanostructure of the second plurality of nanostructures. In some implementations, the upper portion includes a first width along the direction and the lower portion includes a second width along the direction. The first width is smaller than the second width. In some embodiments, the metal plug includes a third width along the direction and the third width is greater than the first width. In some instances, the upper portion includes a first width along the direction and the lower portion includes a second width along the direction. The first width is greater than the second width. In some embodiments, the metal plug includes a third width along the direction and the third width is greater than the first width. In some instances, the first gate spacer and the second gate spacer include silicon oxycarbonitride and the metal plug includes cobalt.

In yet another exemplary aspect, the present disclosure is directed to a semiconductor structure. The semiconductor structure includes a first vertical stack of nanostructures and a second vertical stack of nanostructures over a substrate, a source/drain feature having a lower portion sandwiched between the first vertical stack of nanostructures and the second vertical stack of nanostructures along a direction and an upper portion disposed over the lower portion, a first gate structure wrapping around the first vertical stack of nanostructures, a second gate structure wrapping around the second vertical stack of nano structures, a first top gate spacer disposed along a sidewall of the first gate structure and over the first vertical stack of nano structures, a second top gate spacer disposed along a sidewall of the second gate structure and over the second vertical stack of nanostructures, and a metal plug disposed directly on the source/drain feature and in contact with the first top gate spacer and the second top gate spacer, wherein the upper portion is sandwiched between the first top gate spacer and the second top gate spacer. A width of the metal plug along the direction is greater than a width of the upper portion along the direction.

In some embodiments, a width of the lower portion is greater than the width of the upper portion. In some embodiments, a width of the lower portion is smaller than the width of the upper portion. In some instances, a first portion of the metal plug extends directly between the upper portion and the first top gate spacer, wherein a second portion of the metal plug extends directly between the upper portion and the second top gate spacer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
   a first dummy gate structure disposed over a first active region,
   a second dummy gate structure disposed over a second active region,
   a first gate spacer extending along a sidewall of the first dummy gate structure and disposed at least partially over a top surface of the first active region,
   a second gate spacer extending along a sidewall of the second dummy gate structure and disposed at least partially over a top surface of the second active region,
   a source/drain feature comprising a lower portion disposed between the first active region and the second active region and an upper portion disposed between the first gate spacer and the second gate spacer,
   treating a portion of the first gate spacer and a portion of the second gate spacer with a remote radical of hydrogen or oxygen;
   removing the treated portion of the first gate spacer and the treated portion of the second gate spacer; and
   after the removal, depositing a metal fill material over the source/drain feature and between the first gate spacer and the second gate spacer.

2. The method of claim 1, wherein the first gate spacer and the second gate spacer comprise silicon oxycarbide, silicon oxynitride, or silicon oxycarbonitride.

3. The method of claim 2, wherein the treating comprises use of hydrogen radical or oxygen radical.

4. The method of claim 1, wherein the removing comprises use of hydrogen fluoride.

5. The method of claim 1, wherein the metal fill material comprises cobalt.

6. The method of claim 1, further comprising:
   after the depositing of the metal fill material, planarizing the workpiece to form a contact plug over the source/drain feature.

7. The method of claim 6, wherein each of the first active region and the second active region includes a plurality of nanostructures disposed one over another.

8. The method of claim 1, further comprising:
   after the removing, depositing a contact etch stop layer (CESL) disposed over the source/drain feature; and
   depositing a dielectric layer over the CESL.

9. The method of claim 8, further comprising:
   replacing the first dummy gate structure and the second dummy gate structure with a first metal gate structure and a second metal gate structure, respectively.

10. A method, comprising:
    receiving a workpiece comprising:
    a first polysilicon gate structure disposed over a first plurality of nanostructures,
    a second polysilicon gate structure disposed over a second plurality of nanostructures,
    a first gate spacer extending along a sidewall of the first polysilicon gate structure,
    a second gate spacer extending along a sidewall of the second polysilicon gate structure,
    a source/drain feature comprising a lower portion disposed between the first plurality of nanostructures and the second plurality of nanostructures along a direction and an upper portion disposed between the first gate spacer and the second gate spacer along the direction,
    etching an outer portion of the first gate spacer and an outer portion of the second gate spacer, wherein the etching comprises:
    treating the first gate spacer and the second gate spacer with a remote radical of hydrogen or oxygen to convert the outer portion of the first gate spacer into a first treated portion and the outer portion of the second gate spacer into a second treated portion, and
    at least partially removing the first treated portions and the second treated portion; and
    after the etching, forming a metal plug over the source/drain feature and between the first gate spacer and the second gate spacer.

11. The method of claim 10, wherein the etching exposes a portion of a topmost nanostructure of the first plurality of nanostructures and a portion of a topmost nanostructure of the second plurality of nanostructures.

12. The method of claim 10,
    wherein the upper portion comprises a first width along the direction,
    wherein the lower portion comprises a second width along the direction,
    wherein the first width is smaller than the second width.

13. The method of claim 12,
    wherein the metal plug comprises a third width along the direction,
    wherein the third width is greater than the first width.

14. The method of claim 10,
    wherein the upper portion comprises a first width along the direction,
    wherein the lower portion comprises a second width along the direction,
    wherein the first width is greater than the second width.

15. The method of claim 14,
    wherein the metal plug comprises a third width along the direction,
    wherein the third width is greater than the first width.

16. The method of claim 10,
    wherein the first gate spacer and the second gate spacer comprise silicon oxycarbonitride,
    wherein the metal plug comprises cobalt.

17. A method, comprising:
    receiving a structure comprising:
    a first dummy gate over a first plurality of nanostructures,
    a second dummy gate over a second plurality of nanostructures,
    a first gate spacer along a sidewall of the first dummy gate,
    a second gate spacer along a sidewall of the second dummy gate, and
    a source/drain feature disposed between and in contact with the first plurality of nanostructures and the second plurality of nanostructures, an upper portion of the source/drain feature being disposed between the first gate spacer and the second gate spacer;
    performing a treatment on the first gate spacer and the second gate spacer to form a first treated portion from the first gate spacer and a second treated portion from the second gate spacer, wherein the treatment is configured to break silicon-nitrogen bonding and silicon-carbon bonding;

removing the first treated portion and the second treated portion; and after the removing, depositing a metal fill material over the source/drain feature.

18. The method of claim 17, wherein the first gate spacer and the second gate spacer comprise silicon oxycarbonitride.

19. The method of claim 18, wherein the first treated portion and the second treated portion comprise silicon oxide.

20. The method of claim 17, wherein the treatment comprises use of hydrogen radical or oxygen radical.

\* \* \* \* \*